US006943037B2

(12) United States Patent
Anagnostopoulos et al.

(10) Patent No.: US 6,943,037 B2
(45) Date of Patent: Sep. 13, 2005

(54) CMOS/MEMS INTEGRATED INK JET PRINT HEAD AND METHOD OF FORMING SAME

(75) Inventors: Constantine N. Anagnostopoulos, Mendon, NY (US); John A. Lebens, Rush, NY (US); David P. Trauernicht, Rochester, NY (US); James M. Chwalek, Pittsford, NY (US); Christopher N. Delametter, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 362 days.

(21) Appl. No.: 10/242,080

(22) Filed: Sep. 12, 2002

(65) Prior Publication Data

US 2003/0016272 A1 Jan. 23, 2003

Related U.S. Application Data

(62) Division of application No. 09/792,114, filed on Feb. 22, 2001, now Pat. No. 6,502,925.

(51) Int. Cl.[7] .......................... H01L 21/00; B41J 2/045; G11B 5/127

(52) U.S. Cl. ............................ 438/3; 438/240; 216/27; 347/62; 347/70

(58) Field of Search ............................ 438/3, 240, 627, 438/928, 977; 257/295, 751, 16, 52, 646; 347/68, 70, 71; 216/2, 16, 27, 56, 99

(56) References Cited

U.S. PATENT DOCUMENTS

| | | | | | |
|---|---|---|---|---|---|
| 6,062,678 | A | * | 5/2000 | Ishinaga et al. | 347/62 |
| 6,142,615 | A | * | 11/2000 | Qiu et al. | 347/70 |
| 6,491,376 | B2 | * | 12/2002 | Trauernicht et al. | 347/47 |

* cited by examiner

*Primary Examiner*—David Nelms
*Assistant Examiner*—Long Tran
(74) *Attorney, Agent, or Firm*—Norman Rushefsky

(57) ABSTRACT

An ink jet print head is formed of a silicon substrate that includes an integrated circuit formed therein for controlling operation of the print head. The silicon substrate has one or more ink channels formed therein along the longitudinal direction of the noble array. An insulating layer or layers overlie the silicon substrate and has a series or an array of nozzle openings or bores formed therein along the length of the substrate and each nozzle opening communicates with an ink channel. The area comprising the nozzle openings forms a generally planar surface to facilitate maintenance of the printhead. A heater element is associated with each nozzle opening or bore for asymmetrically heating ink as ink passes through the nozzle opening or bore.

23 Claims, 26 Drawing Sheets

CM OS/MEMS INTEGRATED INK JET PRINT HEAD AND METHOD OF FORMING SAME

CROSS REFERENCE TO RELATED APPLICATION

This is a Divisional application of U.S. application Ser. No. 09/792,114, filed Feb. 22, 2001 now U.S. Pat. No. 6,502,925, entitled; CMOS/MEMS INTEGRATED INK JET PRINT HEAD AND METHOD OF FORMING SAME.

FIELD OF THE INVENTION

This invention generally relates to the field of digitally controlled printing devices, and in particular to liquid ink print heads which integrate multiple nozzles on a single substrate and in which a liquid drop is selected for printing by thermo-mechanical means.

BACKGROUND OF THE INVENTION

Ink jet printing has become recognized as a prominent contender in the digitally controlled, electronic printing arena because, e.g., of its non-impact, low noise characteristics and system simplicity. For these reasons, ink jet printers have achieved commercial success for home and office use and other areas.

Ink jet printing mechanisms can be categorized as either continuous (CIJ) or Drop-on-Demand (DOD). U.S. Pat. No. 3,946,398, which issued to Kyser et al. in 1970, discloses a DOD ink jet printer which applies a high voltage to a piezoelectric crystal, causing the crystal to bend, applying pressure on an ink reservoir and jetting drops on demand. Piezoelectric DOD printers have achieved commercial success at image resolutions greater than 720 dpi for home and office printers. However, piezoelectric printing mechanisms usually require complex high voltage drive circuitry and bulky piezoelectric crystal arrays, which are disadvantageous in regard to number of nozzles per unit length of print head, as well as the length of the print head. Typically, piezoelectric print beads contain at most a few hundred nozzles.

Great Britain Patent No. 2,007,162, which issued to Endo et al., in 1979, discloses an electrothermal drop-on-demand ink jet printer that applies a power pulse to a heater which is in thermal contact with water based ink in a nozzle. A small quantity of ink rapidly evaporates, forming a bubble, which causes a drop of ink to be ejected from small apertures along an edge of a heater substrate. This technology is known as thermal ink jet or bubble jet.

Thermal ink jet printing typically requires that the heater generates an energy impulse enough to heat the ink to a temperature near 400° C. which causes a rapid formation of a bubble. The high temperatures needed with this device necessitate the use of special inks, complicates driver electronics, and precipitates deterioration of heater elements through cavitation and kogation. Kogation is the accumulation of ink combustion by-products that encrust the heater with debris. Such encrusted debris interferes with the thermal efficiency of the heater and thus shorten the operational life of the print head. And, the high active power consumption of each heater prevents the manufacture of low cost, high speed and page wide print heads.

Continuous inkjet printing itself dates back to at least 1929. See U.S. Pat. No. 1,941,001 which issued to Hansell that year.

U.S. Pat. No. 3,373,437 which issued to Sweet et al. in March 1968, discloses an array of continuous ink jet nozzles wherein ink drops to be printed are selectively charged and deflected towards the recording medium. This technique is known as binary deflection continuous ink jet printing, and is used by several manufacturers, including Elmjet and Scitex.

U.S. Pat. No. 3,416,153, issued to Hertz et al. in December 1968. This patent discloses a method of achieving variable optical density of printed spots, in continuous inkjet printing. The electrostatic dispersion of a charged drop stream serves to modulatate the number of droplets which pass-through a small aperture. This technique is used in ink jet printers manufactured by Iris.

U.S. Pat. No. 4,346,387, entitled METHOD AND APPARATUS FOR CONTROLLING THE ELECTRIC CHARGE ON DROPLETS AND INK JET RECORDER INCORPORATING THE SAME issued in the name of Carl H. Hertz on Aug. 24, 1982. This patent discloses a CIJ system for controlling the electrostatic charge on droplets. The droplets are formed by breaking up of a pressurized liquid stream, at a drop formation point located within an electrostatic charging tunnel, having an electrical field. Drop formation is effected at a point in the electrical field corresponding to whatever predetermined charge is desired. In addition to charging tunnels, deflection plates are used to actually deflect the drops. The Hertz system requires that the droplets produced be charged and then deflected into a gutter or onto the printing medium. The charging and deflection mechanisms are bulky and severely limit the number of nozzles per print head.

Until recently, conventional continuous ink jet techniques all utilized, in one form or another, electrostatic charging tunnels that were placed close to the point where the drops are formed in the stream. In the tunnels, individual drops may be charged selectively. The selected drops are charged and deflected downstream by the presence of deflector plates that have a large potential difference between them. A gutter (sometimes referred to as a "catcher") is normally used to intercept the charged drops and establish a non-print mode, while the uncharged drops are free to strike the recording medium in a print mode as the ink stream is thereby deflected, between the "non-print" mode and the "print" mode.

Typically, the charging tunnels and drop deflector plates in continuous ink jet printers operate at large voltages, for example 100 volts or more, compared to the voltages commonly considered damaging to conventional CMOS circuitry, typically 25 volts or less. Additionally, there is a need for the inks in electrostatic continuous ink jet printers to be conductive and to carry current. As is well-known in the art of semiconductor manufacture, it is undesirable from the point of view of reliability to pass current bearing liquids in contact with semiconductor surfaces. Thus the manufacture of continuous ink jet print heads has not been generally integrated with the manufacture of CMOS circuitry.

Recently, a novel continuous ink jet printer system has been developed which renders the above-described electrostatic charging tunnels unnecessary. Additionally, it serves to better couple the functions of (1) droplet formation and (2) droplet deflection. That system is disclosed in the commonly assigned U.S. Pat. No. 6,079,821 entitled CONTINUOUS INK JET PRINTER WITH ASYMMETRIC HEATING DROP DEFLECTION filed in the names of James Chwalek, Dave Jeanmaire and Constantine Anagnostopoulos, the contents of which are incorporated herein by reference. This patent discloses an apparatus for controlling ink in a continuous ink jet printer. The apparatus comprises an ink delivery channel, a source of pressurized ink in communication with the ink delivery channel, and a nozzle having a bore which opens into the ink delivery channel, from which a continuous stream of ink flows. Periodic application of weak heat pulses to the stream by a heater causes the ink stream to break up into a plurality of droplets synchronously with the applied heat pulses and at a position spaced from the nozzle. The droplets are deflected by increased heat pulses from the heater (in the nozzle bore) which heater has a selectively actuated section, i.e. the section associated with only a portion of the nozzle bore. Selective actuation of a particular heater section, constitutes what has been termed an asymmetrical application of heat to the stream. Alternating the sections can, in turn, alternate the direction in which this asymmetrical heat is supplied and serves to thereby deflect ink drops, inter alia, between a "print" direction (onto a recording medium) and a "non-print" direction (back into a "catcher"). The patent of Chwalek et al. thus provides a liquid printing system that affords significant improvements toward overcoming the prior art problems associated with the number of nozzles per print head, print head length, power usage and characteristics of useful inks.

Asymmetrically applied heat results in stream deflection, the magnitude of which depends on several factors, e.g. the geometric and thermal properties of the nozzles, the quantity of applied heat, the pressure applied to, and the physical, chemical and thermal properties of the ink. Although solvent-based (particularly alcohol-based) inks have quite good deflection patterns (see in this regard U.S. application Ser. No. 09/451,790 filed in the names of Trauernicht et al), and achieve high image quality in asymmetrically heated continuous ink jet printers, water-based inks are more problematic. The water-based inks do not deflect as much, thus their operation is not robust. In order to improve the magnitude of the ink droplet deflection within continuous ink jet asymmetrically heated printing systems there is disclosed in commonly assigned U.S. application Ser. No. 09/470,638 filed Dec. 22, 1999 in the names of Delametter et al. a continuous inkjet printer having improved ink drop deflection, particularly for aqueous based inks, by providing enhanced lateral flow characteristics, by geometric obstruction within the ink delivery channel.

The invention to be described herein builds upon the work of Chwalek et al. and Delametter et al. in terms of constructing continuous ink jet printheads that are suitable for low-cost manufacture and preferably for printheads that can be made page wide.

Although the invention may be used with ink jet print heads that are not considered to be page wide print heads there remains a widely recognized need for improved ink jet printing systems, providing advantages for example, as to cost, size, speed, quality, reliability, small nozzle orifice size, small droplets size, low power usage, simplicity of construction in operation, durability and manufacturability. In this regard, there is a particular long-standing need for the capability to manufacture page wide, high resolution ink jet print heads. As used herein, the term "page wide" refers to print heads of a minimum length of about four inches. High-resolution implies nozzle density, for each ink color, of a minimum of about 300 nozzles per inch to a maximum of about 2400 nozzles per inch.

To take full advantage of page wide print heads with regard to increased printing speed, they must contain a large number of nozzles. For example, a conventional scanning type print head may have only a few hundred nozzles per ink color. A four inch page wide printhead, suitable for the printing of photographs, should have a few thousand nozzles. While a scanned printhead is slowed down by the need for mechanically moving it across the page, a page wide printhead is stationary and paper moves past it. The image can theoretically be printed in a single pass, thus substantially increasing the printing speed.

There are two major difficulties in realizing page wide and high productivity ink jet print heads. The first is that nozzles have to be spaced closely together, of the order of 10 to 80 micrometers, center to center spacing. The second is that the drivers providing the power to the heaters and the electronics controlling each nozzle must be integrated with each nozzle, since attempting to make thousands of bonds or other types of connections to external circuits is presently impractical.

One way of meeting these challenges is to build the print heads on silicon wafers utilizing VLSI technology and to integrate the CMOS circuits on the same silicon substrate with the nozzles.

While a custom process, as proposed in the patent to Silverbrook, U.S. Pat. No. 5,880,759 can be developed to fabricate the print heads, from a cost and manufacturability point of view it is preferable to first fabricate the circuits using a nearly standard CMOS process in a conventional VLSI facility. Then, to post process the wafers in a separate MEMS (micro-electromechanical systems) facility for the fabrication of the nozzles and ink channels.

SUMMARY OF THE INVENTION

It is therefore an object of the invention to provide a CIJ printhead that may be fabricated at lower cost and improved manufacturability as compared to those ink jet printheads known in the prior art that require more custom processing.

It is another object of the invention to provide a CIJ printhead that features a planar surface suitable for cleaning of the printhead.

In accordance with a first aspect of the invention, there is provided an inkjet print comprising a silicon substrate including an integrated circuit formed therein for controlling operation of the print head, the silicon substrate having one or more ink channels formed therein; an insulating layer or layers overlying the silicon substrate, the insulating layer or layers having a series of ink jet bores formed therein along the length of the substrate and forming a generally planar surface and each bore communicates with an ink channel; and a heater element associated with each nozzle bore that is located proximate the bore for asymmetrically heating ink as it passes through the bore.

In accordance with a second aspect of the invention, there is provided a method of operating a continuous ink jet printhead comprising providing a silicon substrate having an integrated circuit formed therein for controlling operation of the print head, the silicon substrate having one or more ink channels formed therein, the silicon substrate being covered by one or more insulating layers having a channel formed therein and terminating at a nozzle opening, the surface of the printhead being relatively planar for facilitating maintenance of the printhead around the nozzle openings; moving ink under pressure from the one or more channels formed in the silicon substrate to a respective ink channel formed in the insulating layer or layers; and asymmetrically heating the ink at the nozzle opening formed in a relatively thin membrane formed covering the insulating layer or layers to affect deflection of ink droplet(s), each nozzle communicating with an ink channel formed in the insulating layer or layers.

In accordance with a third aspect of the invention, there is provided a method of forming a continuous ink jet print head comprising providing a silicon substrate having an integrated circuit for controlling operation of the print head, the silicon substrate having an insulating layer or layers formed thereon, the insulating layer or layers having electrical conductors formed therein that are electrically connected to circuits formed in the silicon substrate, forming in the insulating layer or layers a series of relatively large bores each of which extends from the surface of the insulating layer or layers to the silicon substrate, depositing a sacrificial layer in each of the series of bores; forming over the sacrificial layer in each bore an insulating layer or layers that include a heater element; forming a nozzle opening in the insulating layer or layers that include a heater element; and removing the sacrificial layer from each of the bores to form a print head having a relatively planar surface around the area of the nozzle bores to facilitate maintenance of the printhead.

In accordance with a fourth aspect of the invention, there is provided an ink jet print head comprising a silicon substrate including an integrated circuit formed therein for controlling operation of the print head, the silicon substrate having one or more ink channels formed therein, an insulating layer or layers overlying the silicon substrate, the insulating layer or layers having a series of ink jet nozzle bores formed therein along the length of the substrate and each bore being formed in a thin membrane that communicates with an ink channel; the ink channel being formed in the insulating layer or layers; and a heater element associated with each nozzle bore that is located within the membrane and proximate the bore for asymmetrically heating ink as it passes through the bore.

These and other objects, features and advantages of the present invention will become apparent to those skilled in the art upon reading of the following detailed description when taken in conjunction with the drawings wherein there are shown and described illustrative embodiments of the invention.

BRIEF DESCRIPTION OF THE DRAWINGS

While the specification concludes with claims particularly pointing out and distinctly claiming the subject matter of the present invention, it is believed the invention will be better understood from the following detailed description when taken in conjunction with the accompanying drawings.

DETAILED DESCRIPTION OF THE INVENTION

This description will be directed in particular to elements forming part of, or cooperating more directly with, apparatus in accordance with the present invention. It is to be understood that elements not specifically shown or described may take various forms well known to those skilled in the art.

Figure 20:
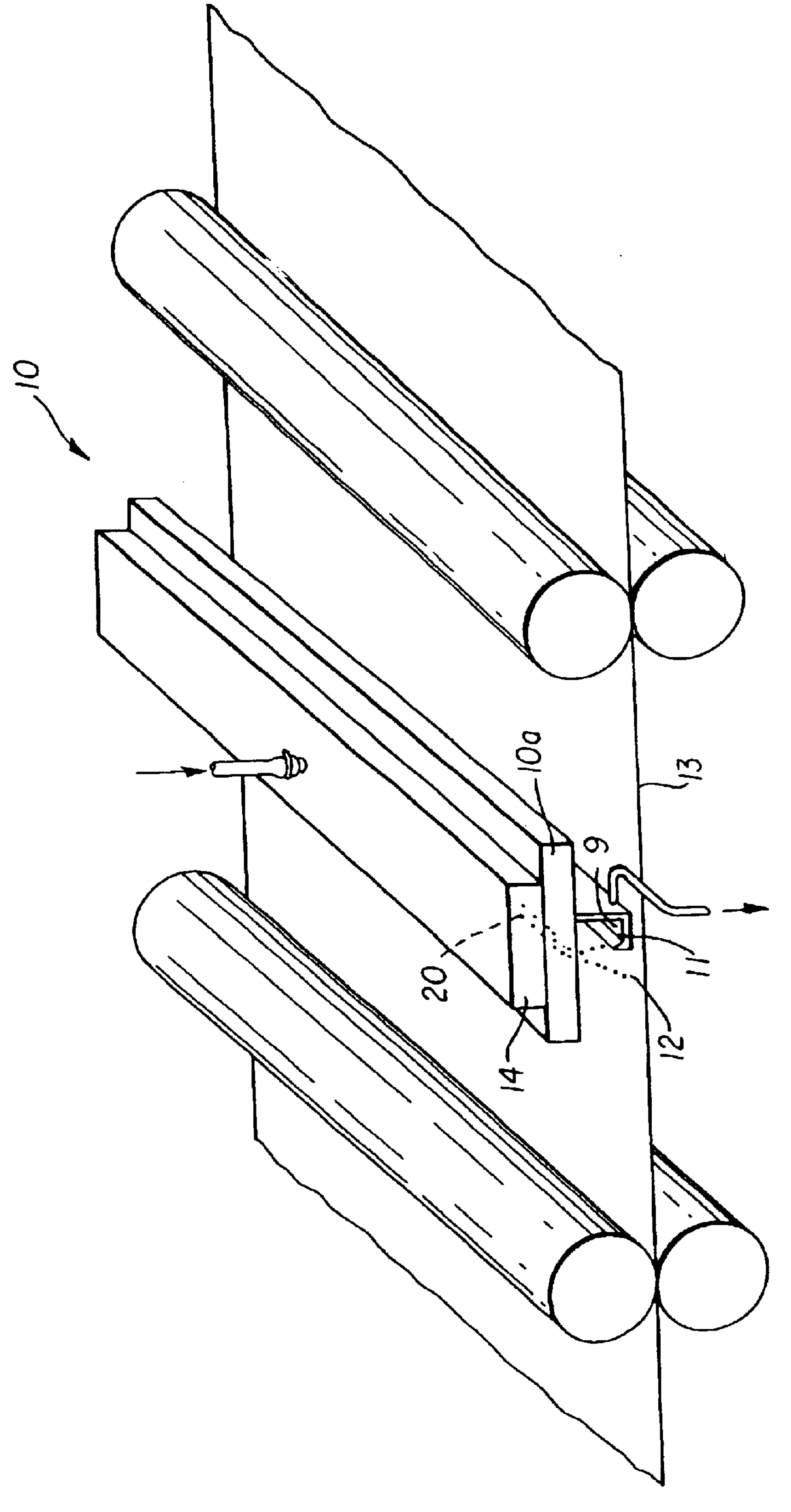
FIG. 20 illustrates a schematic diagram of an exemplary continuous ink jet print head and nozzle array as a print medium (e.g. paper) rolls under the ink jet print head.

Referring to FIG. 20, a continuous ink jet printer system is generally shown at 10. The printhead 10*a,* from which extends an array of nozzles 20, incorporating heater control circuits (not shown).

Heater control circuits read data from an image memory, and send time-sequenced electrical pulses to the heaters of the nozzles of nozzle array 20. These pulses are applied an appropriate length of time, and to the appropriate nozzle, so that drops formed from a continuous ink jet stream will form spots on a recording medium 13, in the appropriate position designated by the data sent from the image memory. Pressurized ink travels from an ink reservoir (not shown) to an ink delivery channel, built inside member 14 and through nozzle array 20 on to either the recording medium 13 or the gutter 19. The ink gutter 19 is configured to catch undeflected ink droplets 11 while allowing deflected droplets 12 to reach a recording medium. The general description of the continuous inkjet printer system of FIG. 20 is also suited for use as a general description in the printer system of the invention.

Figure 1:
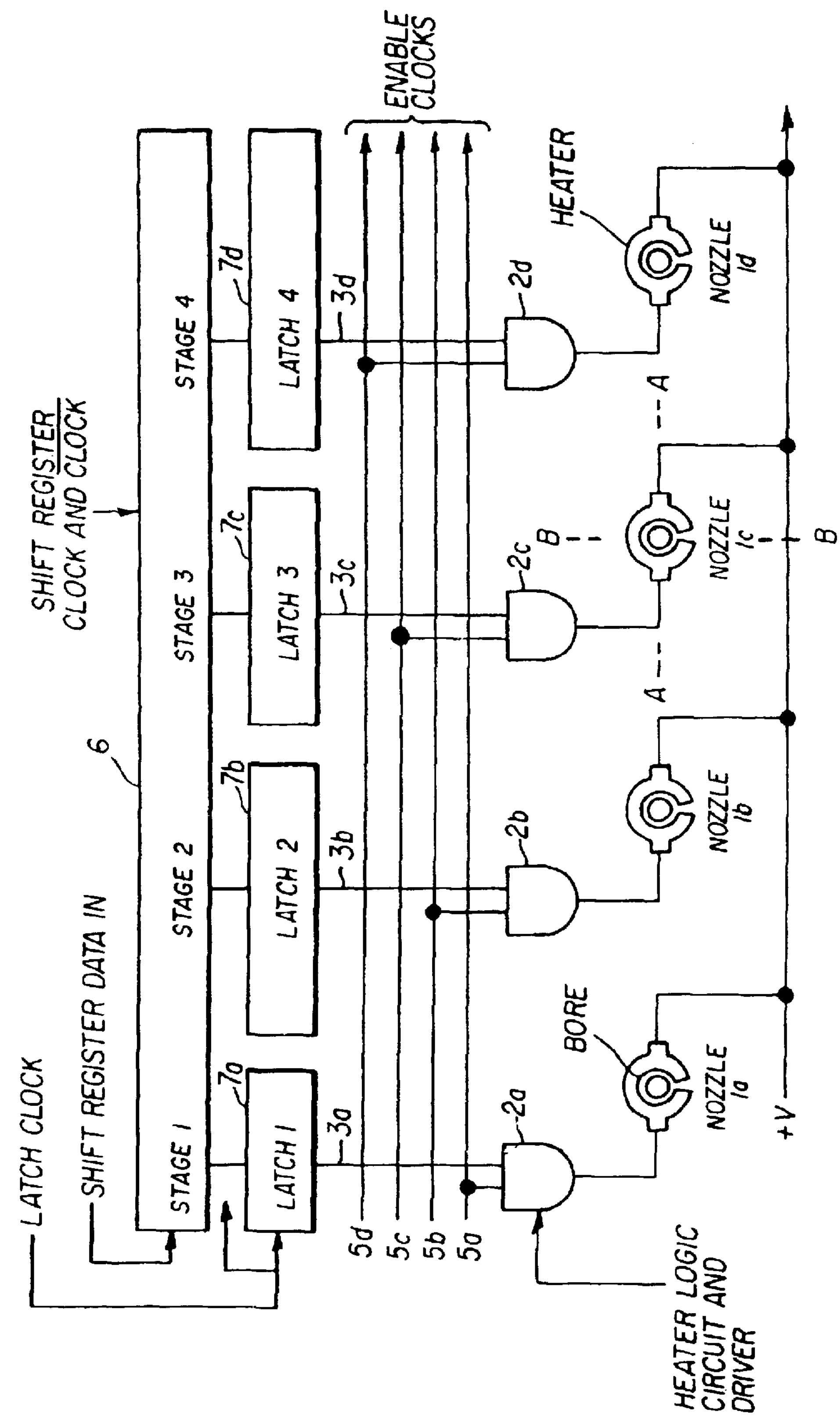
FIG. 1 is a schematic and fragmentary top view of a print head constructed in accordance with the present invention.

Referring to FIG. 1, there is shown a top view of an ink jet print head according to the teachings of the present invention. The print head comprises an array of nozzles 1*a*–1*d* arranged in a line or a staggered configuration. Each nozzle is addressed by a logic AND gate (2*a*–2*d*) each of which contains logic circuitry and a heater driver transistor (not shown). The logic circuitry causes a respective driver transistor to turn on if a respective signal on a respective data input line (3*a*–3*d*) to the AND gate (2*a*–2*d*) and the respective enable clock lines (5*a*–5*d*), which is connected to the logic gate, are both logic ONE. Furthermore, signals on the enable clock lines (5*a*–5*d*) determine durations of the lengths of time current flows through the heaters in the particular nozzles 1*a*–1*d.* Data for driving the heater driver transistor may be provided from processed image data that is input to a data shift register 6. The latch register 7*a*–7*d,* in response to a latch clock, receives the data from a respective shift register stage and provides a signal on the lines 3*a*–3*d* representative of the respective latched signal (logical ONE or ZERO) representing either that a dot is to be printed or not on a receiver. In the third nozzle, the lines A—A and B—B define the direction in which crosssectional views are taken.

Figure 1A:
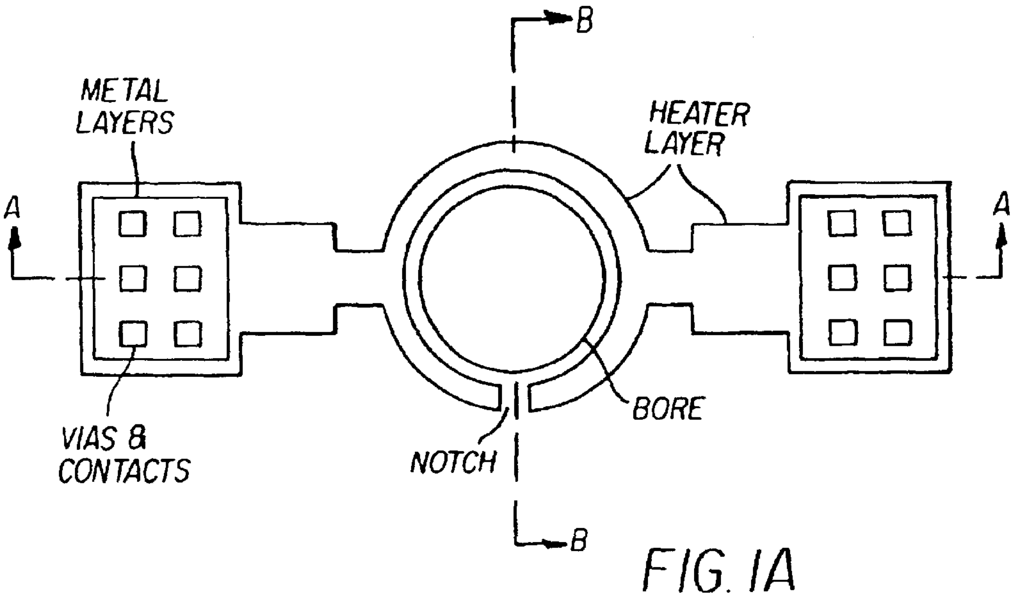
FIG. 1A is a simplified top view of a nozzle with a "notch" type heater for a CU print bead in accordance with the invention.

FIGS. 1A–1F show more detailed top views of the two types of heaters (the "notch type" and "split type" respectively) used in CU print heads. They produce asymmetric heating of the jet and thus cause ink jet deflection. Asymmetrical application of heat merely means supplying electrical current to one or the other section of the heater independently in the case of a split type heater. In the case of a notch type heater applied current to the notch type heater will inherently involve an asymmetrical heating of the ink. With reference now to FIG. 1A, there is illustrated a top view of an ink jet printhead nozzle with a notched type heater. The heater is formed adjacent the exit opening of the nozzle. The heater element material substantially encircles the nozzle bore but for a very small notched out area, just enough to cause an electrical open. These nozzle bores and associated heater configurations are illustrated as being circular, but can be non-circular as disclosed by Jeanmaire et al. in commonly assigned U.S. application Ser. No. 09/466,346 filed Dec. 17, 1999, the contents of which are incorporated herein by reference. As noted also with reference to FIG. 1, one side of each heater is connected to a common bus line, which in turn is connected to the power supply typically +5 volts. The other side of each heater is connected to a logic AND gate within which resides an MOS transistor driver capable of delivering up to 30 mA of current to that heater. The AND gate has two logic inputs. One is from the Latch 7*a*–*d* which has captured the information from the respective shift register stage indicating whether the particular heater will be activated or not during the present line time. The other input is the enable clock that determines the length of time and sequence of pulses that are applied to the particular heater. Typically there are two or more enable clocks in the printhead so that neighboring heaters can be turned on at slightly different times to avoid thermal and other cross talk effects.

Figure 1B:
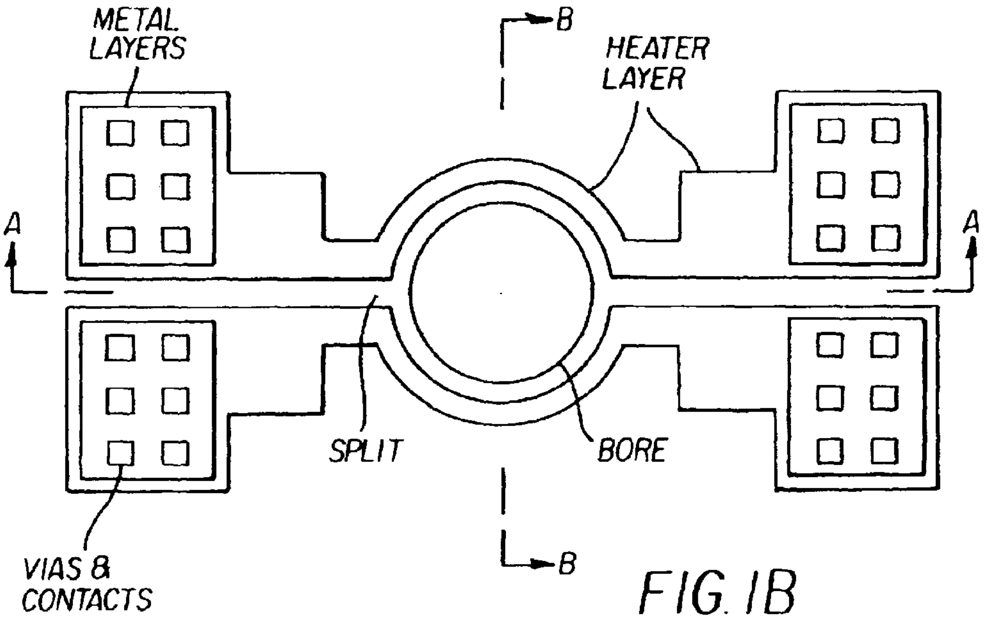
FIG. 1B is a simplified top view of a nozzle with a split type heater for a CIJ print head made in accordance with the invention.
Figure 1C:
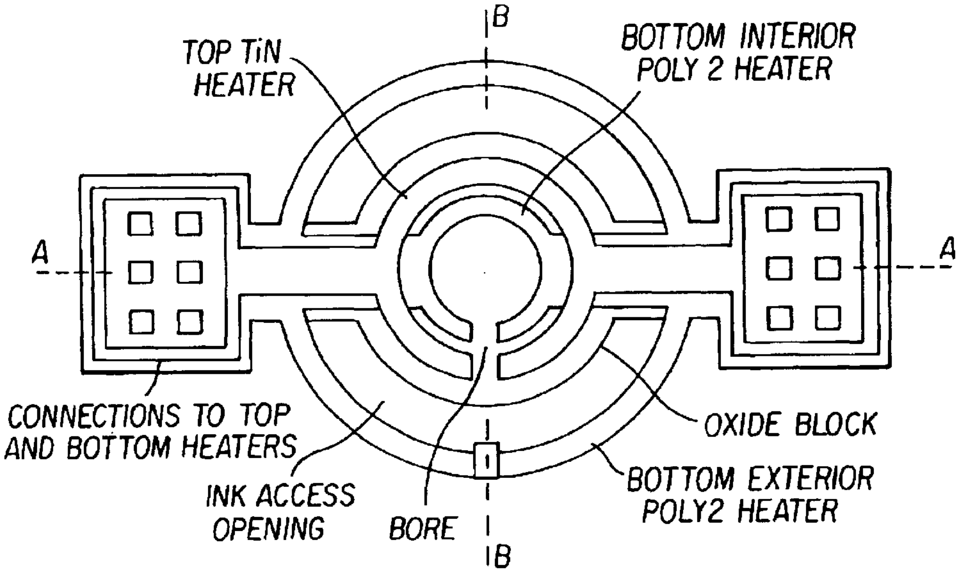
FIG. 1C is a simplified top view of a nozzle with top and dual bottom "notch" type heaters for a CU print head in accordance with the invention.
Figure 1D:
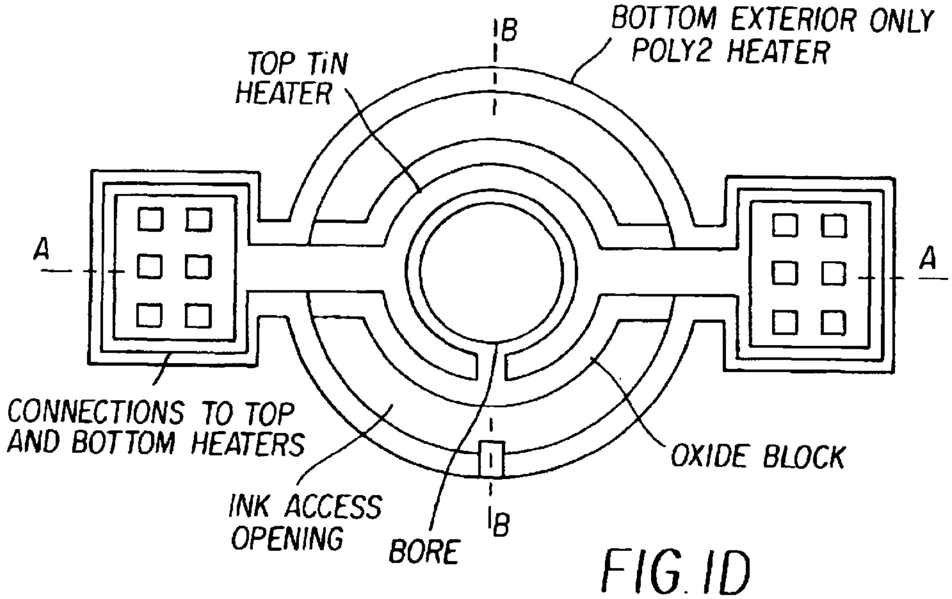
FIG. 1D is a simplified top view of a nozzle with top and single bottom "notch" type heaters for a CIJ print head in accordance with the invention.
Figure 1E:
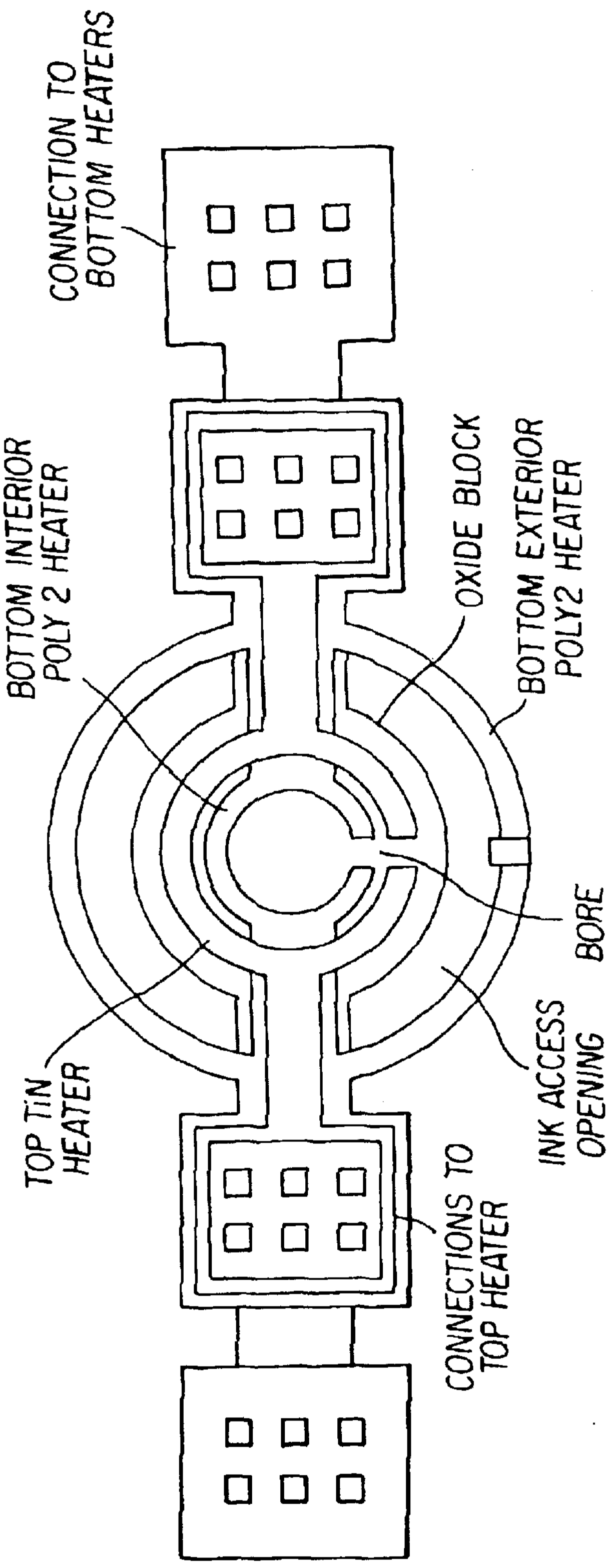
FIG. 1E is a simplified top view of a nozzle with top and dual bottom "notch" type heaters that are independently driven for a CIJ print head in accordance with the invention.
Figure 1F:
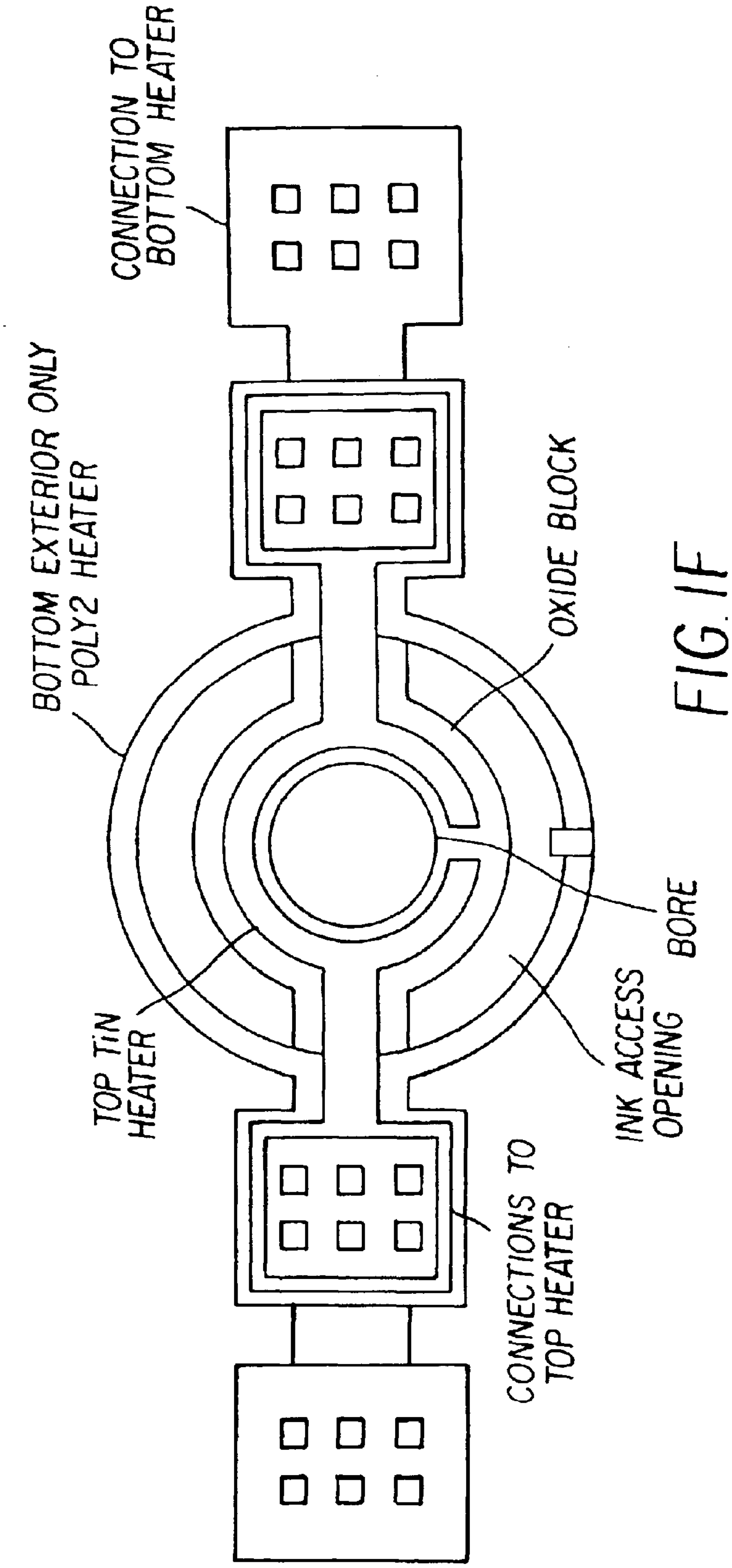
FIG. 1F is a simplified top view of a nozzle with top and single bottom "notch" type heaters that are independently driven for a CIJ print head in accordance with the invention.

With reference to FIG. 1B, there is illustrated the nozzle with a split type heater wherein there are essentially two semicircular heater elements surrounding the nozzle bore adjacent the exit opening thereof. Separate conductors are provided to the upper and lower segments of each semi circle, it being understood that in this instance upper and lower refer to elements in the same plane. Vias are provided that electrically contact the conductors to metal layers associated with each of these conductors. These metal layers are in turn connected to driver circuitry formed on a silicon substrate as will be described below.

With reference to FIGS. 1C, 1D, 1E and 1F, there are illustrated nozzles with multiple notch type heaters located at different heights along the ink flow path. Vias are provided that electrically contact the conductors to metal layers associated with each of the contact pads. These metal layers are in turn connected to driver circuitry formed on a silicon substrate as will be described below. The top and bottom heaters can be connected in parallel and thus fired simultaneously or have their own lines so they can be activated at different times.

If not fired simultaneously, it is preferred to fire the bottom heaters at a small advance ahead of the top heaters.

Figure 2:
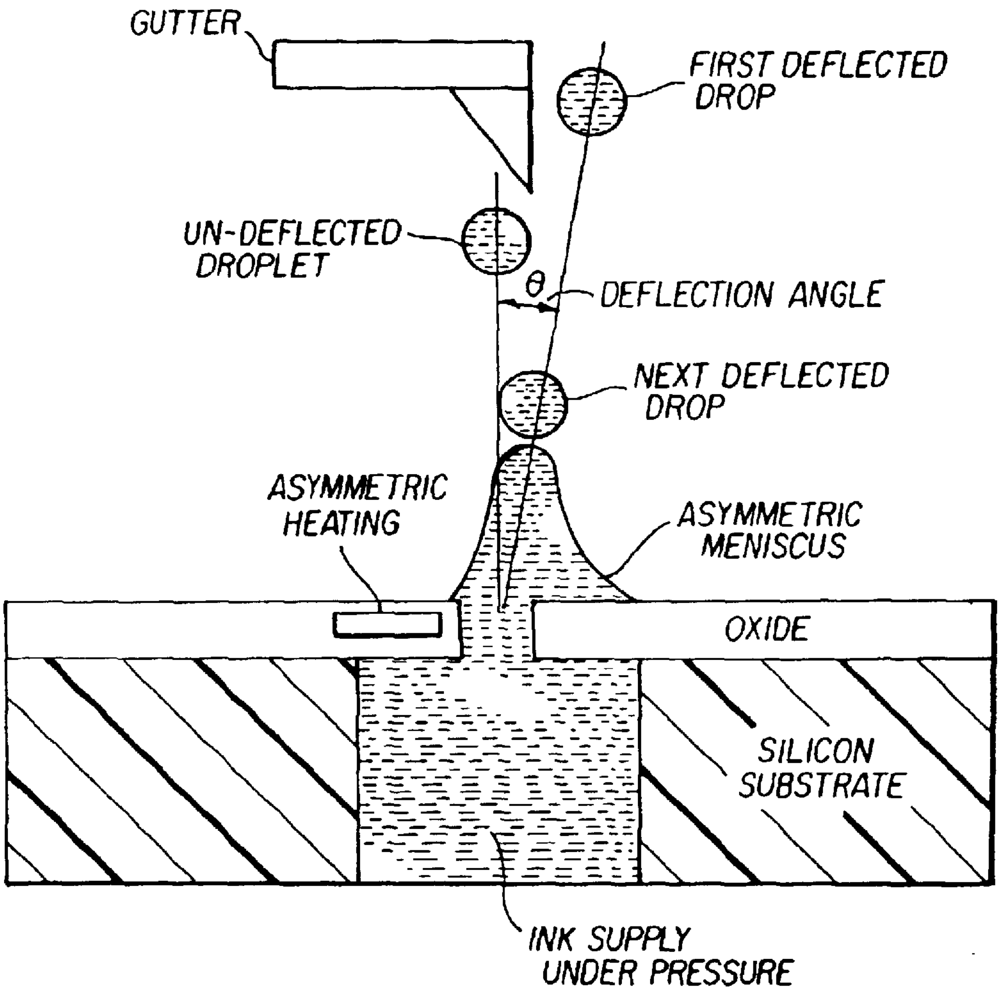
FIG. 2 is cross-sectional view of the nozzle with notch type heater, the sectional view taken along line B—B of FIG. 1A.

In FIG. 2, there is shown a simplified cross-sectional view of an operating nozzle across the B—B direction. As mentioned above, there is an ink channel formed under the nozzle bores to supply the ink. This ink supply is under pressure typically between 15 to 25 psi for a typical bore diameter of about 8.8 micrometers and using a typical ink with a viscosity of 4 centipoise or less. The ink in the delivery channel emanates from a pressurized reservoir (not shown), leaving the ink in the channel under pressure. This pressure is adjusted to yield the desired velocity for the streams of fluid emanating from the nozzles. The constant pressure can be achieved by employing an ink pressure regulator (not shown). Without any current flowing to the heater, a jet forms that is straight and flows directly into the gutter. On the surface of the printhead a symmetric meniscus forms around each nozzle that is a few microns larger in diameter than the bore. If a current pulse is applied to the heater, the meniscus in the heated side pulls in and the jet deflects away from the heater. The droplets that form then bypass the gutter and land on the receiver. When the current through the heater is returned to zero, the meniscus becomes symmetric again and the jet direction is straight. The device could just as easily operate in the opposite way, that is, the deflected droplets are directed into the gutter and the printing is done on the receiver with the non-deflected droplets. Also, having all the nozzles in a line is not absolutely necessary. It is just simpler to build a gutter that is essentially a straight edge rather than one that has a staggered edge that reflects the staggered nozzle arrangement.

In typical operation, the heater resistance is of the order of 400 ohms for a heater conform all to an 8.8 micrometers diameter bore, the current amplitude is between 10 to 20 mA, the pulse duration is about 2 microseconds and the resulting deflection angle for pure water is of the order of a few degrees, in this regard reference is made to U.S. application Ser. No. 09/221,256, entitled "Continuous Ink Jet Printhead Having Power-Adjustable Multi-Segmented Heaters" and to U.S. application Ser. No. 09/221,342 entitled "Continuous Ink Jet Printhead Having Multi-Segmented Heaters", both filed Dec. 28, 1998.

The application of periodic current pulses causes the jet to break up into synchronous droplets, to the applied pulses. These droplets form about 100 to 200 micrometers away from the surface of the printhead and for an 8.8 micrometers diameter bore and about 2 microseconds wide, 200 kHz pulse rate, they are typically 3 to 4 pL in volume. The drop volume generated is a function of the pulsing frequency, the bore diameter and the jet velocity. The jet velocity is determined by the applied pressure for a given bore diameter and fluid viscosity as mentioned previously. The bore diameter may range from 1 micrometer to 100 micrometers, with a preferred range being 6 micrometers to 16 micrometers. Thus the heater pulsing frequency is chosen to yield the desired drop volume.

Figure 3:
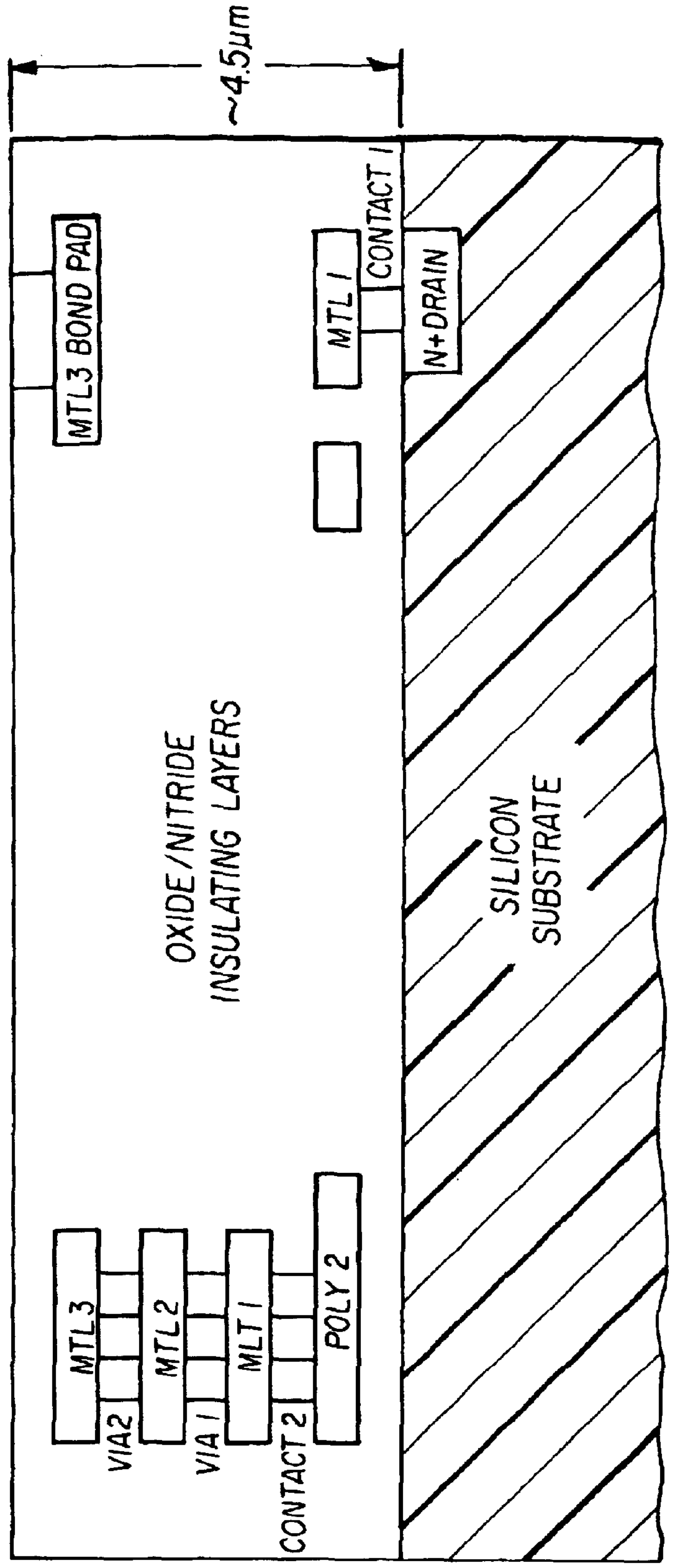
FIG. 3 is a simplified schematic sectional view taken along line A-B of FIG. 1D and illustrating the nozzle area just after the completion of all the conventional CMOS fabrication steps in accordance with a first embodiment of the invention.

The cross-sectional view taken along sectional line A-B and shown in FIG. 3 represents an incomplete stage in the formation of a printhead in which nozzles are to be later formed in an array wherein CMOS circuitry is integrated on the same silicon substrate.

As was mentioned earlier, the CMOS circuitry is fabricated first on the silicon wafers as one or more integrated circuits. The CMOS process may be a standard 0.5 micrometers mixed signal process incorporating two levels of polysilicon and three levels of metal on a six inch diameter wafer. Wafer thickness is typically 675 micrometers. In FIG. 3, this process is represented by the three layers of metal, shown interconnected with vias. Also polysilicon level 2 and an N+ diffusion and contact to metal layer 1 are drawn to indicate active circuitry in the silicon substrate. The gate electrodes of the CMOS transistor devices are formed using one of the polysilicon layers.

Because of the need to electrically insulate the metal layers, dielectric layers are deposited between them making the total thickness of the film on top of the silicon wafer about 4.5 micrometers.

The structure illustrated in FIG. 3 basically would provide the necessary interconnects, transistors and logic gates for providing the control components illustrated in FIG. 1.

As a result of the conventional CMOS fabrication steps, a silicon substrate of approximately 675 micrometers in thickness and about 6 inches in diameter is provided. Larger or smaller diameter silicon wafers can be used equally as well. A plurality of transistor devices are formed in the silicon substrate through conventional steps of selectively depositing various materials to form these transistors as is well known. Supported on the silicon substrate are a series of layers eventually forming an oxide/nitride insulating layer that has one or more layers of polysilicon and metal layers formed therein in accordance with desired pattern. Vias are provided between various layers as needed and openings may be provided in the surface for allowing access to metal layers to provide for bond pads. The various bond pads are provided to make respective connections of data, latch clock, enable clocks, and power provided from a circuit board mounted adjacent the printhead.

Figure 4:
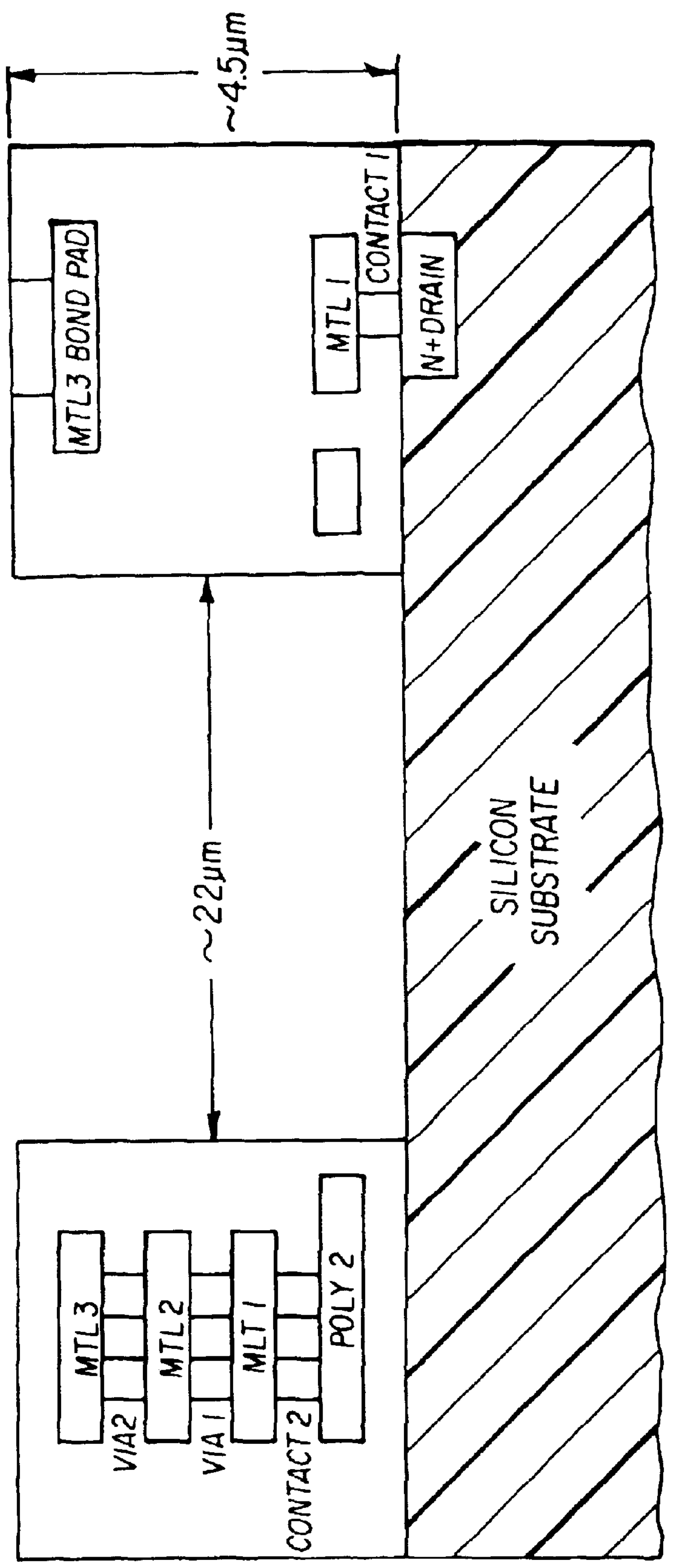
FIG. 4 is a simplified schematic cross-sectional view taken along line A-B of FIG. 1D in the nozzle area after the definition of a large bore in the oxide block using the device formed in FIG. 3.

With reference now also to FIG. 4 which is a similar view to that of FIG. 3 and also taken along line A-B, a mask has been applied to the front side of the wafer and a window of 22 micrometers in diameter is defined. The dielectric layers in the window are then etched down to the silicon surface, which provides a natural etch stop as shown in FIG. 4.

Figure 5:
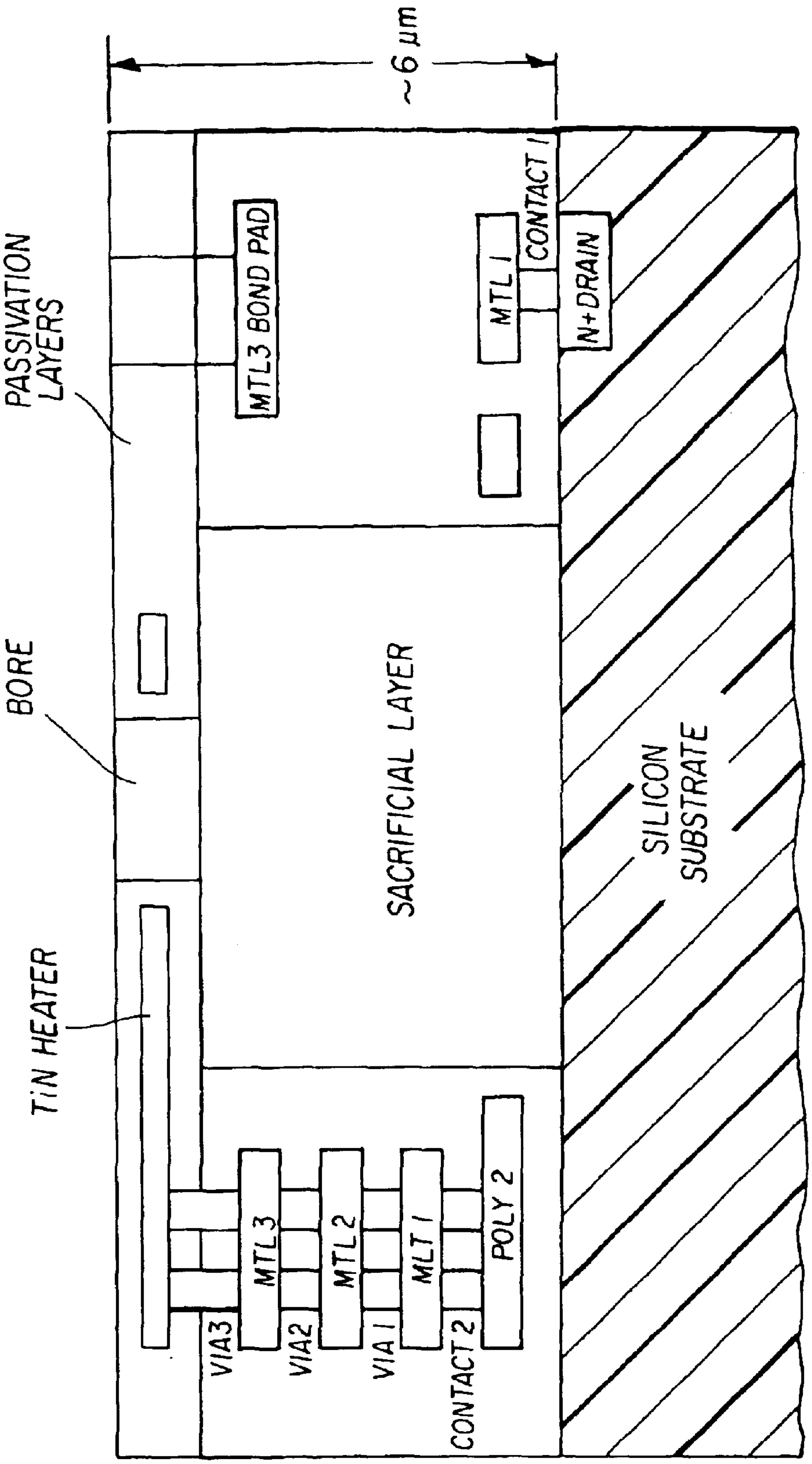
FIG. 5 is a schematic cross-sectional view taken along the line A-B in the nozzle area after deposition and planarization of the sacrificial layer and deposition and definition of the passivation and heater layers and formation of the nozzle bore.

With reference now to FIG. 5, a number of steps are shown combined in this figure. The first step is to fill in the window opened in the previous step with a sacrificial layer such as amorphous silicon or polyimide. The sacrificial layer is deposited sufficiently thick to fully cover the recesses formed between the front surface of the oxide/nitride insulating layer and the silicon substrate. These films are deposited at a temperature lower than 450 degrees centigrade to prevent melting of aluminum layers that are present. The wafer is then planarized.

A thin, about 3500 angstroms, protection layer, such as PECVD $Si_3N_4$, is deposited next and then the via3's to the metal 3 layer are opened. The vias can be filled with Ti/TiN/W and planarized, or they can be etched with sloped sidewalls so that the heater layer, which is deposited next can directly contact the metal3 layer. The heater layer consisting of about 50 angstroms of Ti and 600 angstroms of TiN is deposited and then patterned. A final thin protection (typically referred to as passivation) layer is deposited next. This layer must have properties that, as the one below the heater, protects the heater from the corrosive action of the ink, it must not be easily fouled by the ink and can be cleaned easily when fouled. It also provides protection against mechanical abrasion.

A mask for fabricating the bore is applied next and the passivation layers are etched to open the bore and the bond pads. FIG. 5 shows the cross-sectional view of the nozzle at this stage. It will be understood of course that along the silicon array many nozzle bores are simultaneously etched.

Figure 6:
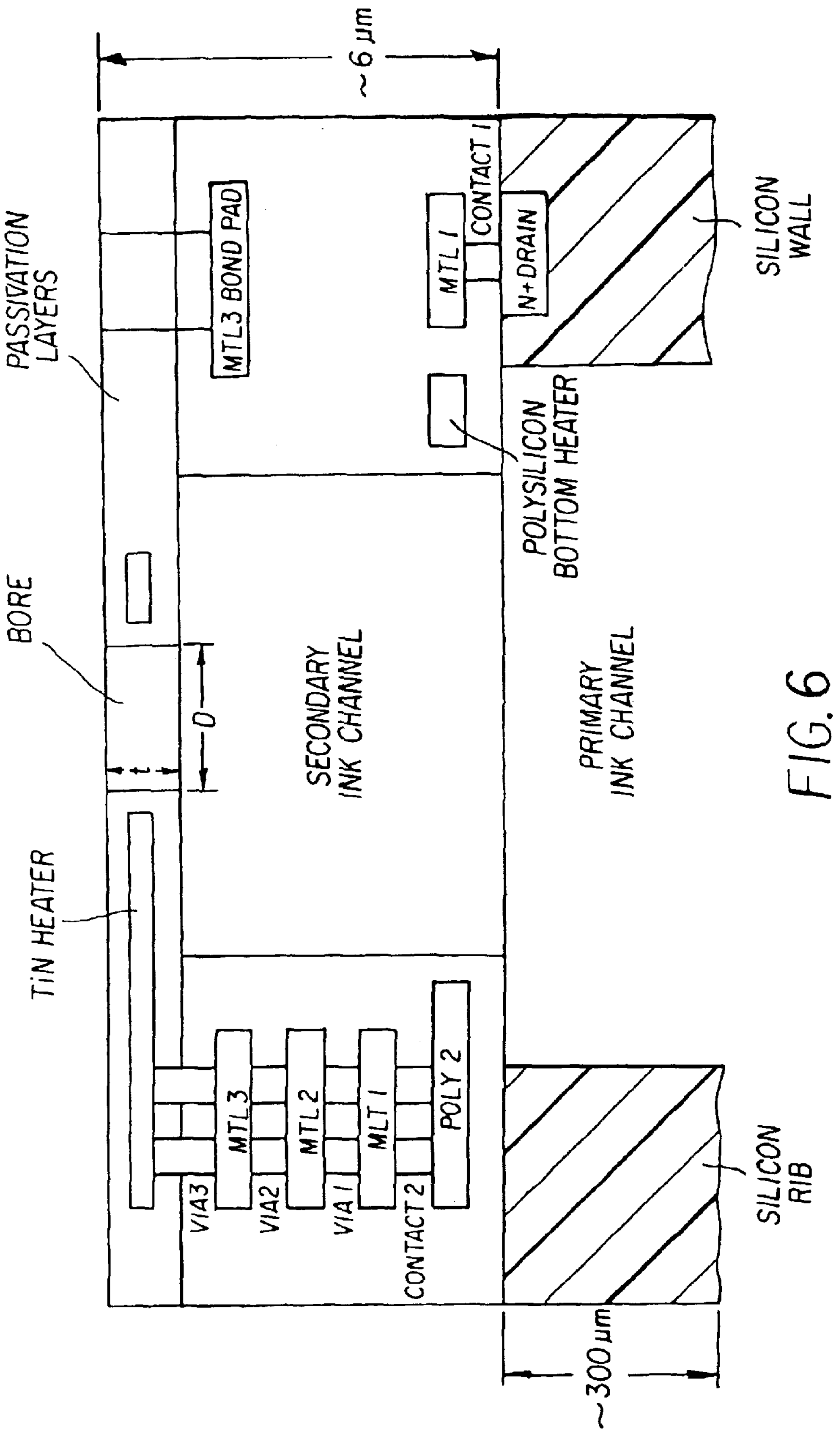
FIG. 6 is a schematic cross-sectional view taken along line A-B in the nozzle area after formation of the ink channels and removal of the sacrificial layer.

The silicon wafer is then thinned from its initial thickness of 675 micrometers to 300 micrometers, see FIG. 6, a mask to open the ink channels is then applied to the backside of the wafer and the silicon is etched, in an STS etcher, all the way to the front surface of the silicon. Thereafter, the sacrificial layer is etched from the backside and the front side resulting in the finished device shown in FIG. 6. It is seen from FIG. 6 that the device now has a flat top surface for easier cleaning and the bore is shallow enough for increased jet deflection. Bore diameters, D, may be in the range of one micrometer to 100 micrometers, with the preferred range being 6 micrometers to 16 micrometers. The thickness of the resulting membrane,t, may be in the range of 0.5 micrometers to 6 micrometers, with the preferred range being 0.5 micrometers to 2.5 micrometers. Furthermore, the temperature during post-processing was maintained below the 420 degrees centigrade annealing temperature of the heater, so its resistance remains constant for a long time. As may be noted from FIG. 6 the embedded heater element effectively surrounds the nozzle bore and is proximate to the nozzle bore which reduces the temperature requirement of the heater for heating the ink jet in the bore.

In FIG. 6, the printhead structure is illustrated with the bottom polysilicon layer extended to the ink channel formed in the oxide layer to provide a polysilicon bottom heater element. The bottom heater element is used to provide an initial preheating of the ink as it enters the ink channel portion in the oxide layer. This structure is created during the CMOS process. However, in accordance with the broader aspects of the invention the supplementary heater elements formed in the polysilicon layer are not essential.

Figure 7:
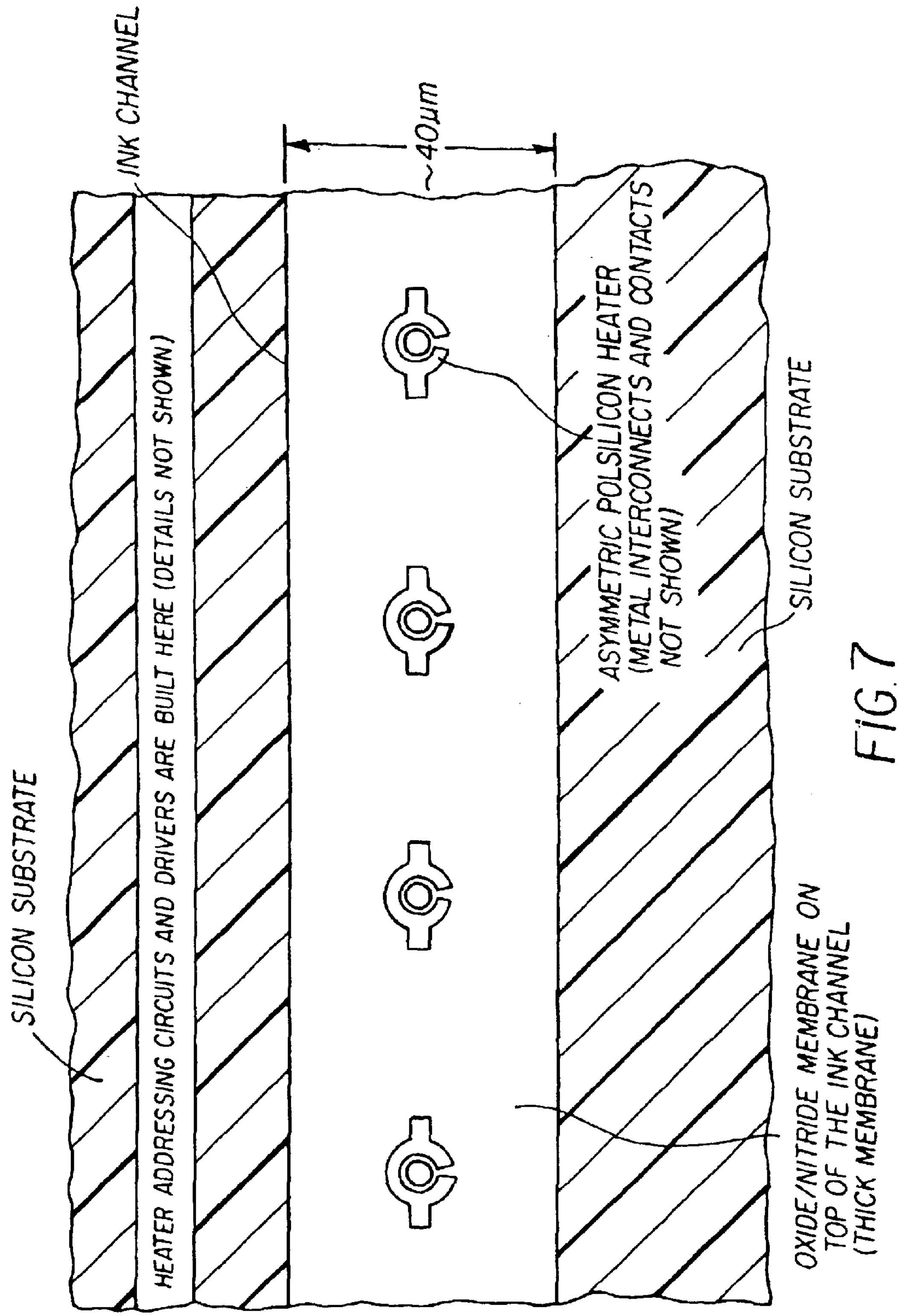
FIG. 7 is a simplified representation of the top view of a small array of nozzles made using the fabrication method illustrated in FIG. 6 and showing a central rectangular ink channel formed in the silicon block.
Figure 8:
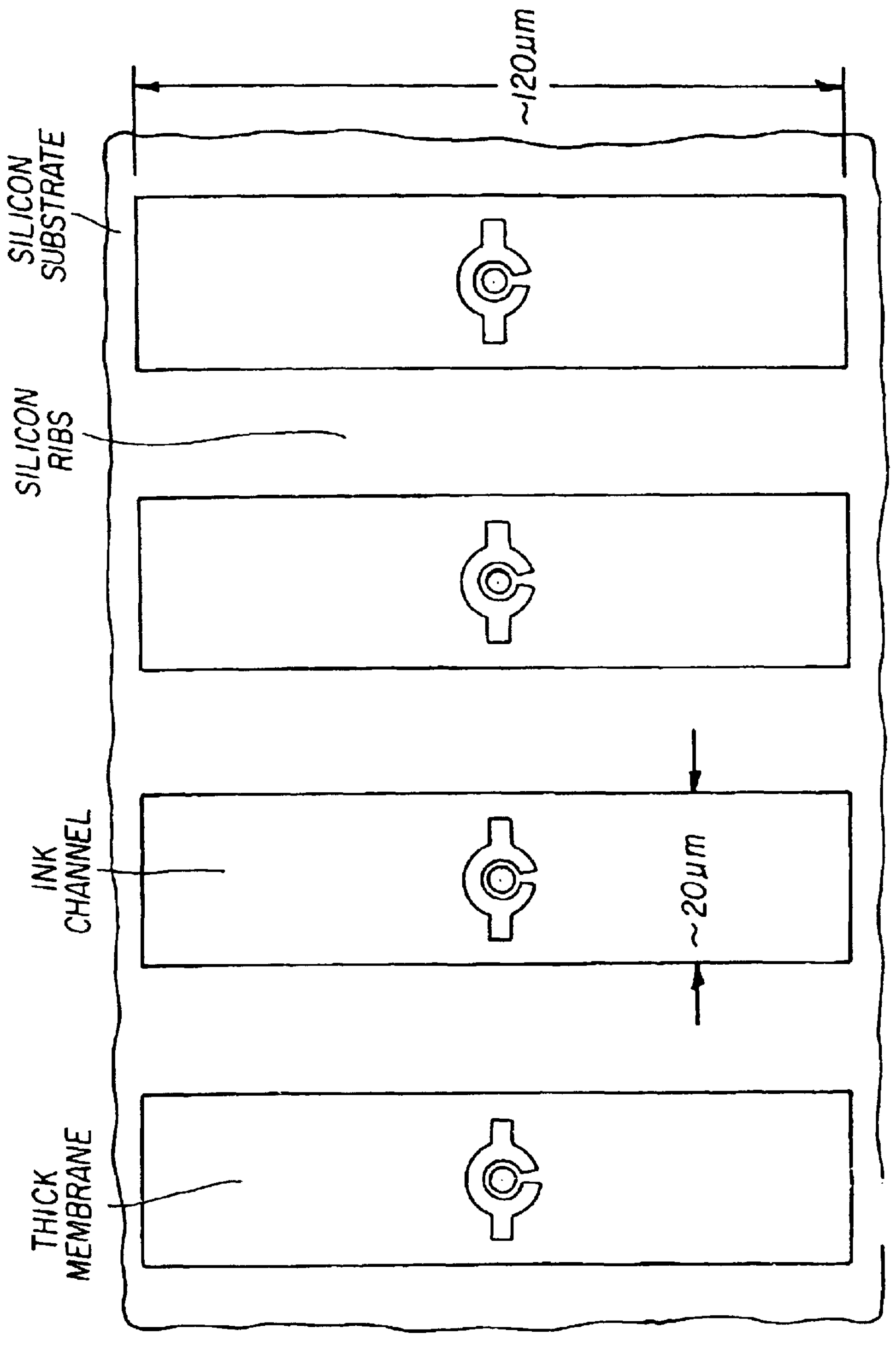
FIG. 8 is a view similar to that of FIG. 7 but illustrating rib structures formed in the silicon wafer that separate each nozzle and which provide increased structural strength and reduce wave action in the ink channel. The rib structures are not actually visible in a top view.

With reference to FIG. 7, the ink channel formed in the silicon substrate is illustrated as being a rectangular cavity passing centrally beneath the nozzle array. However, a long cavity in the center of the die tends to structurally weaken the printhead array so that if the array was subject to torsional stresses, such as during packaging, the membrane could crack. Also, along printheads, pressure variations in the ink channels due to low frequency pressure waves can cause jet jitter. Description will now be provided of an improved design made in accordance with the invention. This improved design consists of leaving behind a silicon bridge or rib between each nozzle of the nozzle array during the etching of the ink channels. These bridges extend all the way from the back of the silicon wafer to the front of the silicon wafer. The ink channel pattern defined in the back of the wafer, therefore, is no longer a long rectangular recess running parallel to the direction of the row of nozzles but is instead a series of smaller rectangular cavities each feeding a single nozzle. To reduce fluidic resistance each individual ink channel is fabricated to be a rectangle of 20 micrometers along the direction of the row of nozzles and 120 micrometers in the direction orthogonal to the row of nozzles, see FIG. 8.

As noted above, in a CIJ printing system it is desirable that jet deflection could be further increased by increasing the portion of ink entering the bore of the nozzle with lateral rather than axial momentum. Such can be accomplished by blocking some of the fluid having axial momentum by building a block in the center of each nozzle just below the nozzle bore.

In accordance with a second embodiment of the invention, a method of constructing a lateral flow structure will now be described. It will be understood of course that although the description will be provided in the following paragraphs relative to formation of a single nozzle that the process is simultaneously applicable to a whole series of nozzles formed in a straight or staggered row along the wafer.

Figure 9A:
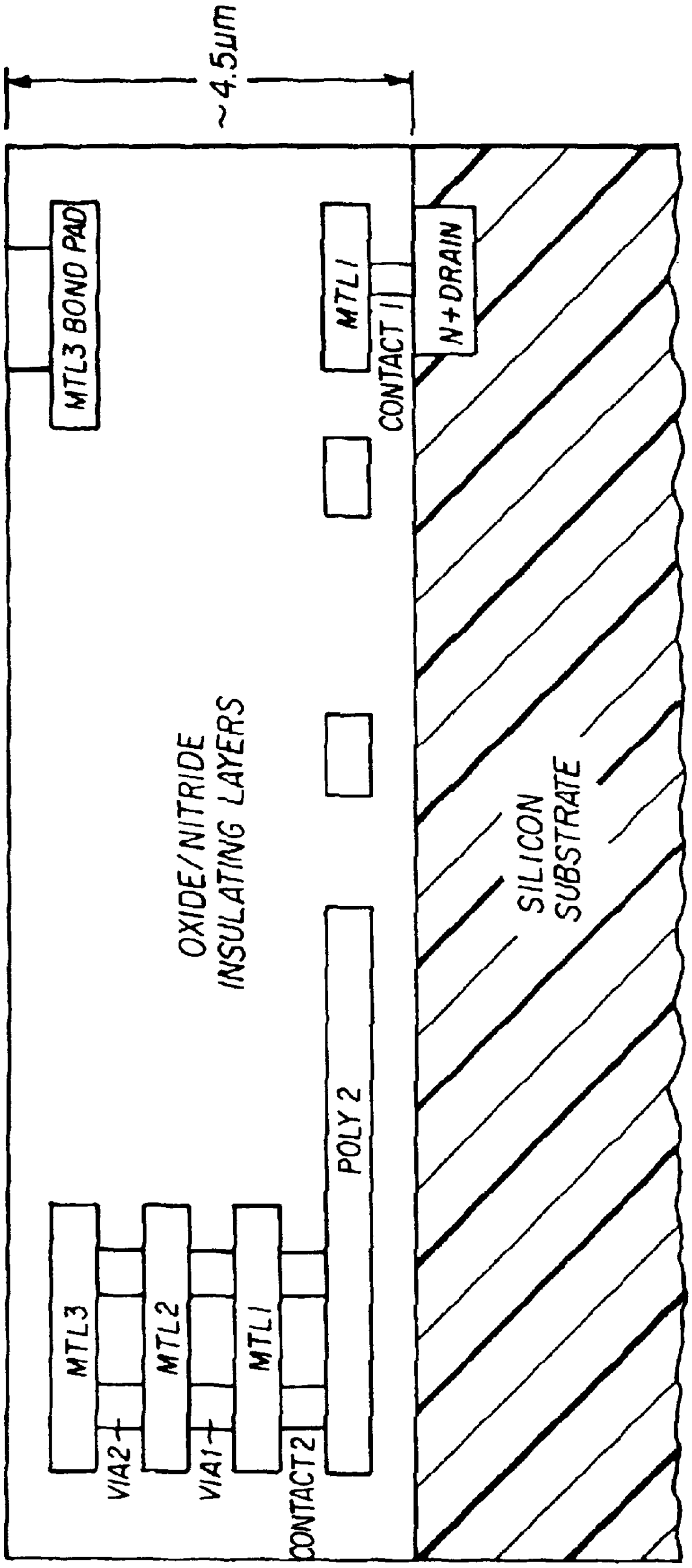
FIG. 9A is a simplified schematic sectional view taken along line A-B of FIG. 1C and illustrating the nozzle area just after the completion of all the conventional CMOS fabrication steps in accordance with a second embodiment of the invention.
Figure 9B:
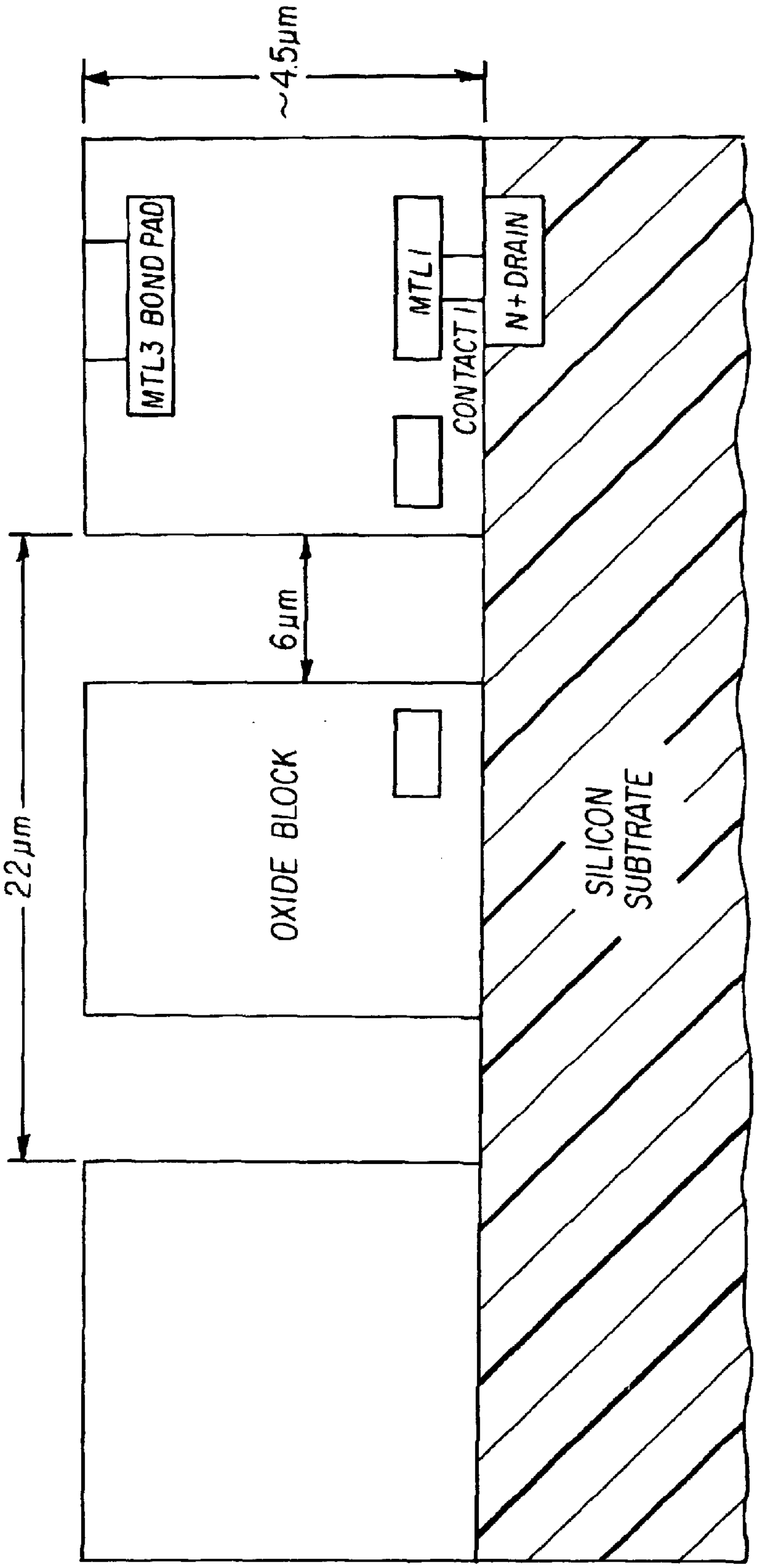
FIG. 9B is a schematic cross-sectional view taken along the line B—B in the nozzle area of FIG. 1C after the definition of an oxide block for lateral flow in accordance with the second embodiment of the invention.
Figure 10:
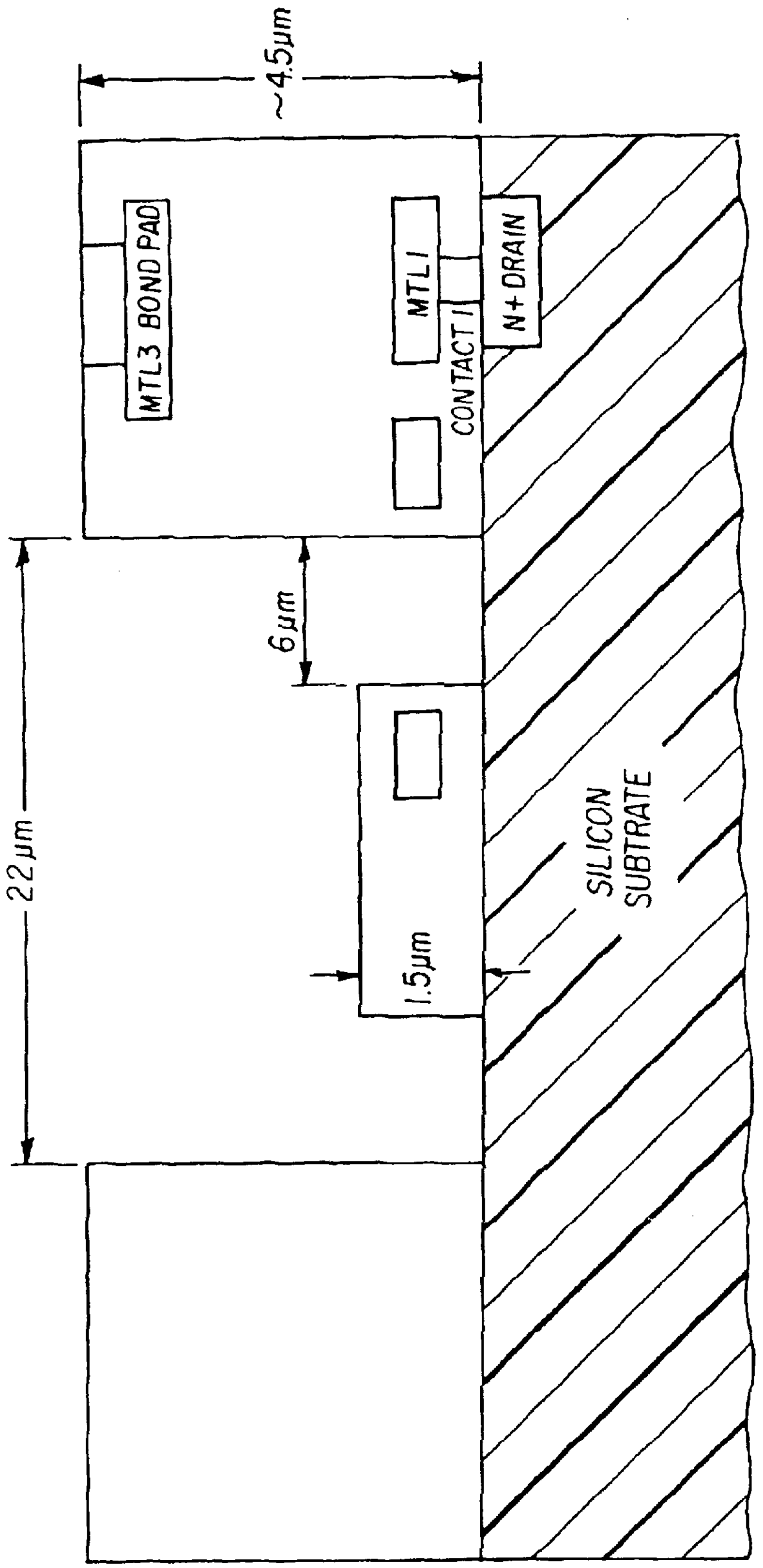
FIG. 10 is a schematic cross-sectional view taken along the line B—B in the nozzle area of FIG. 1C after the further definition of the oxide block for lateral flow.
Figure 11:
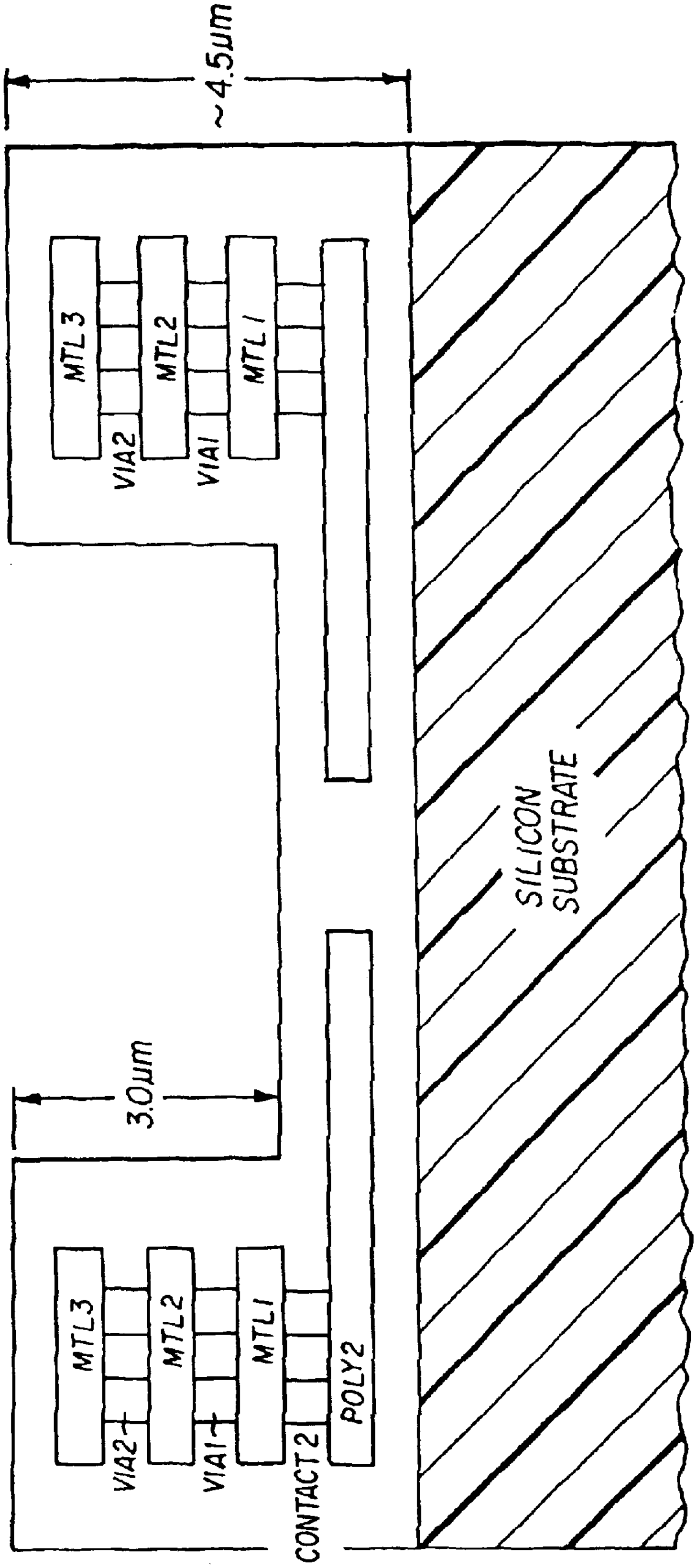
FIG. 11 is a schematic cross-sectional view taken along line A—A in the nozzle area of FIG. 1C after the definition of the oxide block for lateral flow.
Figure 12:
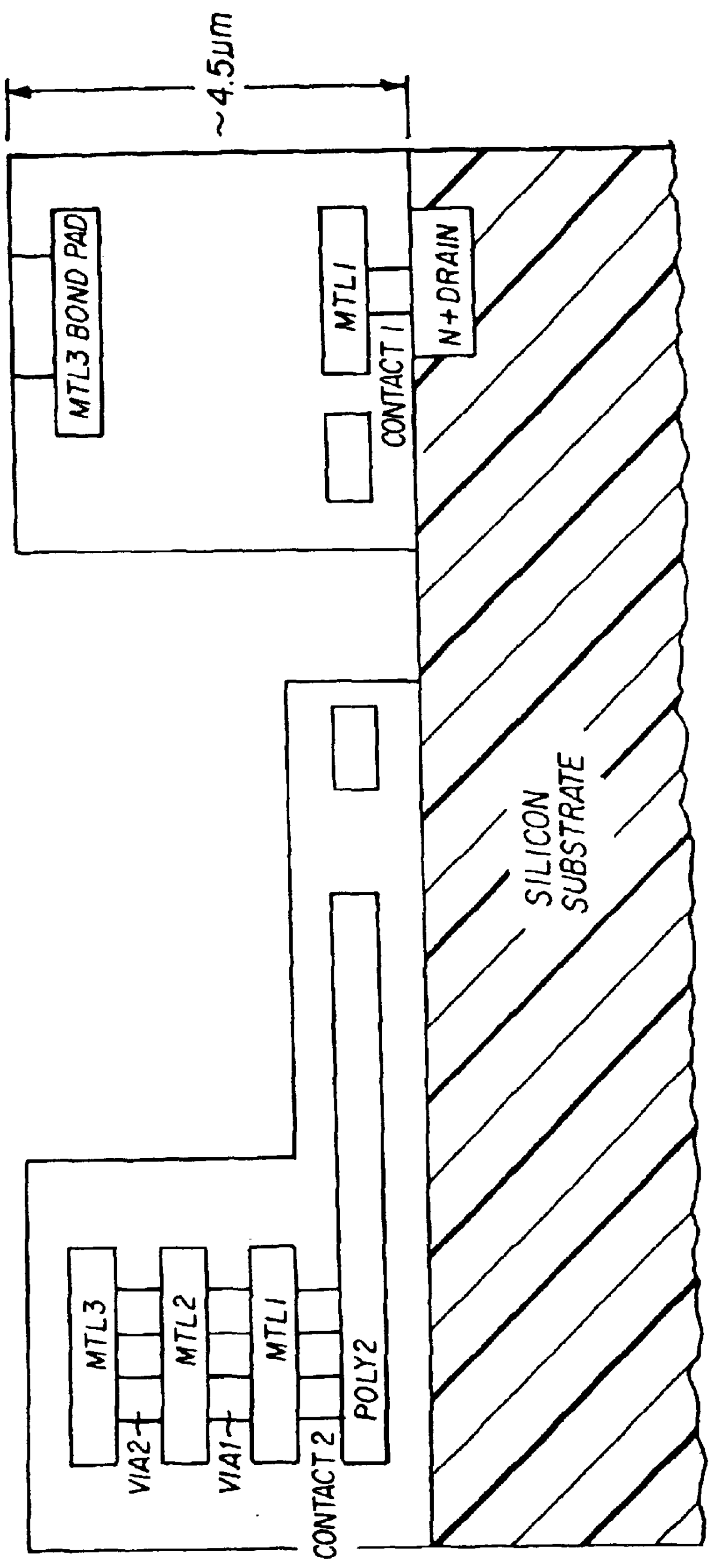
FIG. 12 is a schematic cross-sectional view taken along line A-B in the nozzle area after the definition of the oxide block used for lateral flow.

In accordance with the second embodiment of the invention, a method of constructing of a nozzle array with a ribbed structure but also featuring a lateral flow structure will now be described. With reference to FIG. 9A which as noted above shows a cross-sectional view of the silicon wafer in the vicinity of the nozzle at the end of the CMOS fabrication sequence. The first step in the post-processing sequence is to apply a mask to the front of the wafer at the region of each nozzle opening to be formed. For a particular implementation of the concept of lateral flow device, the mask is shaped so as to allow an etchant to open two 6 micrometer wide semicircular openings co-centric with the nozzle bore to be formed. The outside edges of these openings correspond to a 22 micrometers diameter circle. The dielectric layers in the semicircular regions are then etched completely to the silicon surface as shown in FIG. 9B. A second mask is then applied and is of the shape to permit selective etching of the oxide block shown in FIG. 10. Upon etching, with the second mask in place, the oxide block is etched down to a final thickness or height,b, from the silicon substrate that may range from 0.5 micrometers to 3 micrometers, with a typical thickness of about 1.5 micrometers as shown in FIG. 10 for a cross-section along sectional line B—B and in in FIG. 11 for a cross-section along sectional line A—A. A cross-sectional view of the nozzle area along A-B is shown in FIG. 12.

Thereafter, openings in the dielectric layer are filled with a sacrificial film such as amorphous silicon or polyimide and the wafers are planarized.

Figure 13:
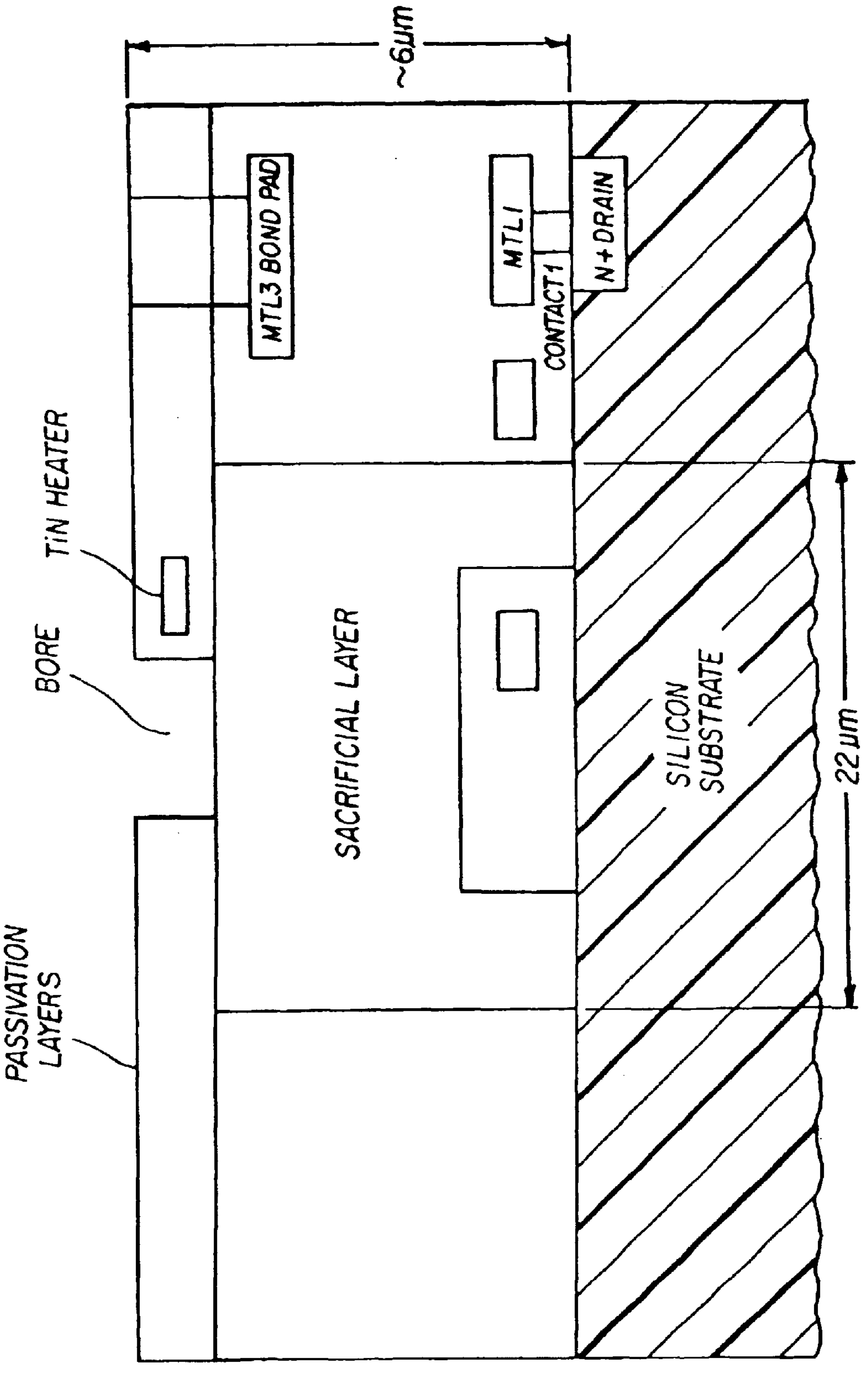
FIG. 13 is a schematic cross-sectional view taken along line B—B in the nozzle area after planarization of the sacrificial layer and deposition and definition of the passivation and heater layers and formation of the nozzle bore.
Figure 14:
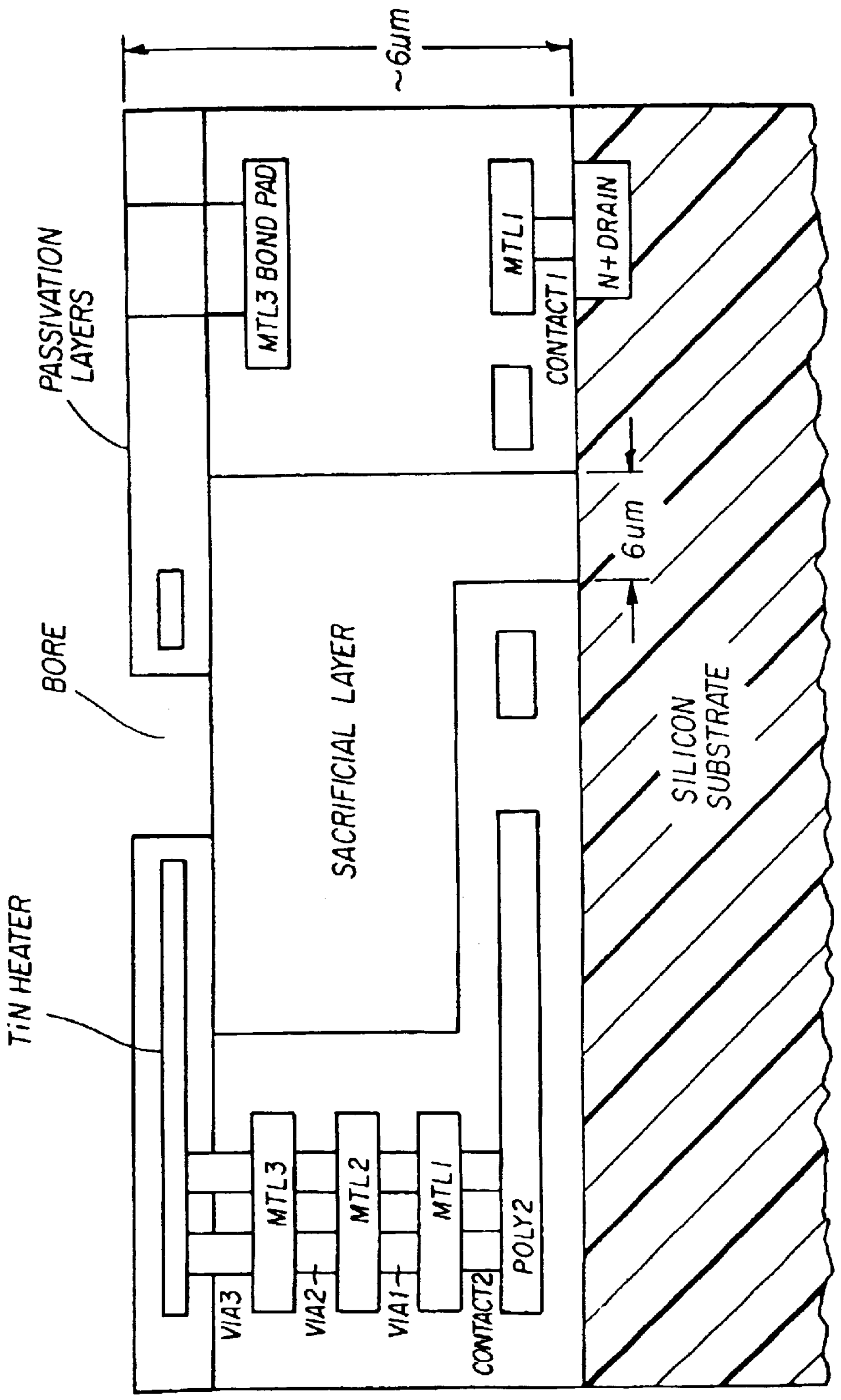
FIG. 14 is a schematic cross-sectional view taken along line A-B in the nozzle area after planarization of the sacrificial layer and deposition and definition of the passivation and heater layers and formation of the bore.

A thin, 3500 angstroms protection membrane or passivation layer, such as PECVD $Si_3N_4$, is deposited next and then the via3's to the metal3 level (mtl3) are opened. See FIGS. 13 and 14 for reference. A thin layer of Ti/TiN is deposited next over the whole wafer followed by a much thicker W layer. The surface is then planarized in a chemical mechanical polishing process sequence that removes the W (wolfram) and Ti/TiN films from everywhere except from inside the via3's. Alternatively, the via3's can be etched with sloped sidewalls so that the heater layer, which is deposited next, can directly contact the metal3 layer. The heater layer consisting of about 50 angstroms of Ti and 600 angstroms of TiN is deposited and then patterned. A final thin protection (typically referred to as passivation) layer is deposited next. This layer must have properties that, as the one below the heater, protects the heater from the corrosive action of the ink, it must not be easily fouled by the ink and it can be cleaned easily when fouled It also provides protection against mechanical abrasion and has the desired contact angle to the ink. To satisfy all these requirements, the passivation layer may consist of a stack of films of different materials. The final membrane thickness,t, encompassing the heater preferably is in the range from 0.5 micrometers to 2.5 micrometers with a typical thickness of about 1.5 micrometers. The resulting gap, G, between the top of the oxide block and the bottom of the membrane encompassing the heater may be in the range of 0.5 micrometers to 5 micrometers, with the typical gap being 3 micrometers. A bore mask is applied next to the front of the wafer and the passivation layers are etched to open the bore for each nozzle and the bond pads. The bore diameters, D, may be in the range of 1 micrometer to 100 micrometers, with the preferred range being 6 micrometers to 16 micrometers. FIGS. 13 and 14 show respective cross-sectional views of each nozzle at this stage. Although only one of the bond pads is shown, it will be understood that multiple bond pads are formed in the nozzle array. The various bond pads are provided to make respective connections of data, latch clock, enable clocks, and power provided from a circuit board mounted adjacent the printhead or from a remote location.

Figure 15:
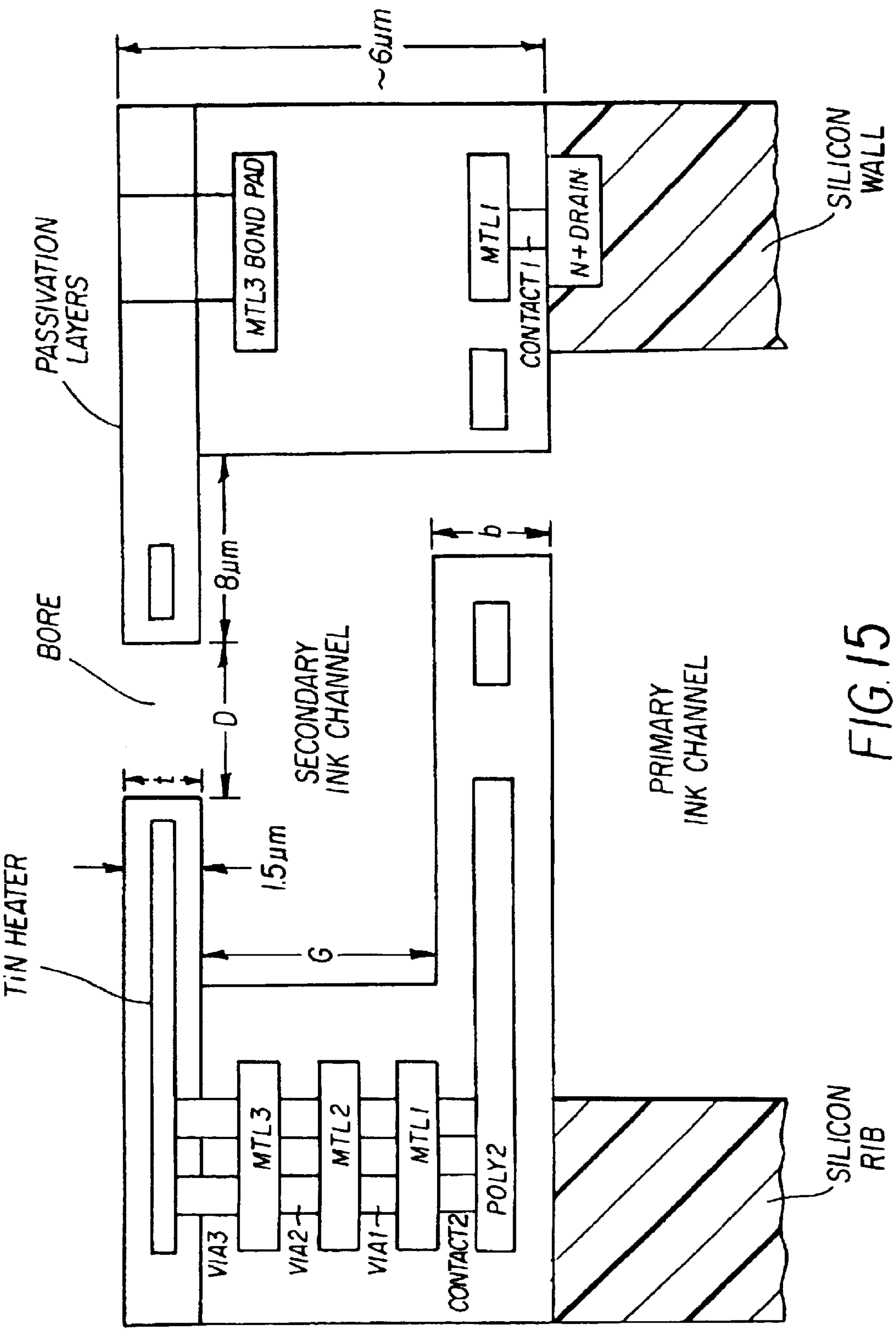
FIG. 15 is a schematic cross-sectional view taken along line A-B in the nozzle area after definition and etching of the ink channels in the silicon wafer and removal of the sacrificial layer.
Figure 18:
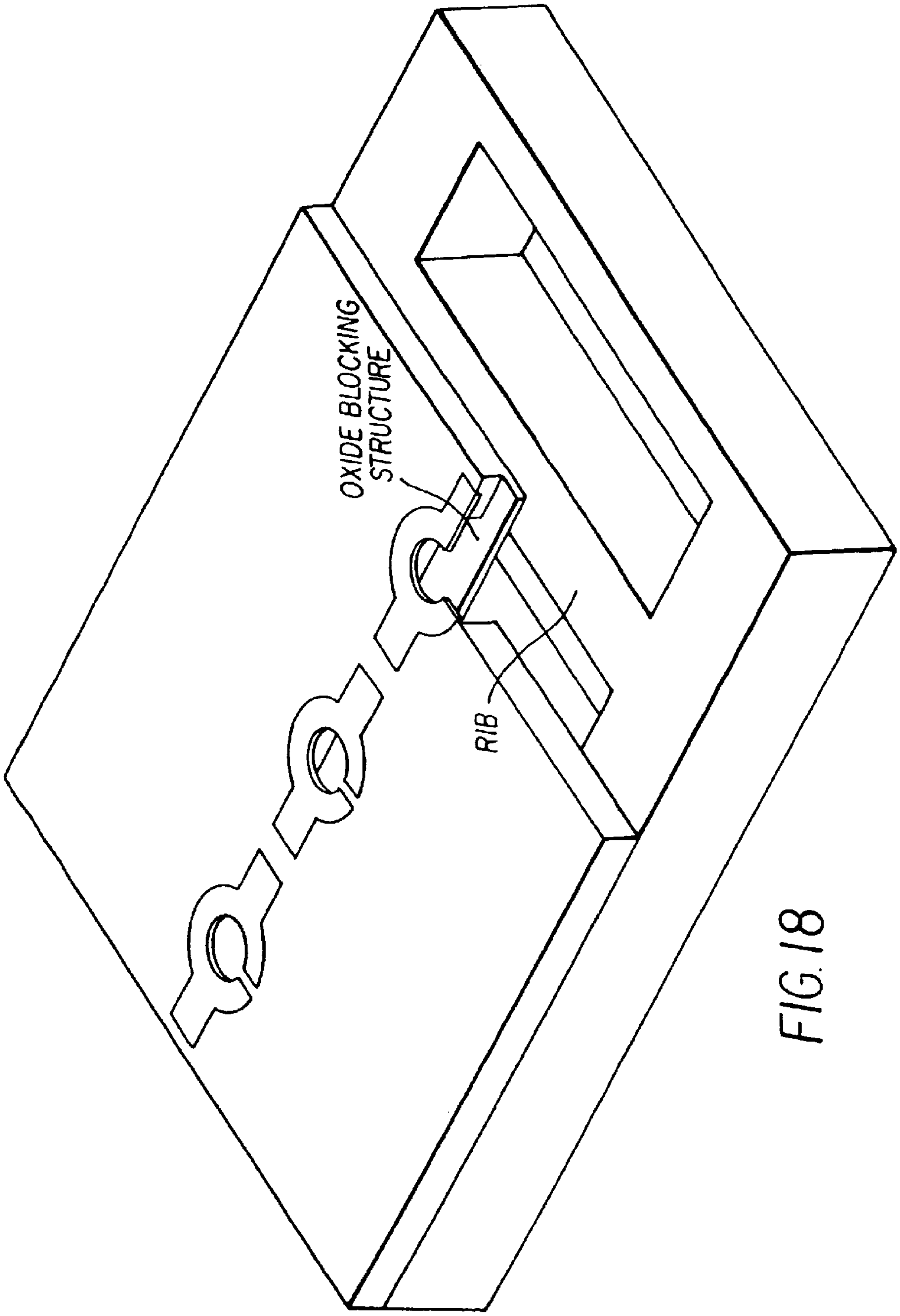
FIG. 18 is a perspective view of a portion of the CMOS/MEMS print head with only a top heater and illustrating a rib structure and an oxide blocking structure.
Figure 19:
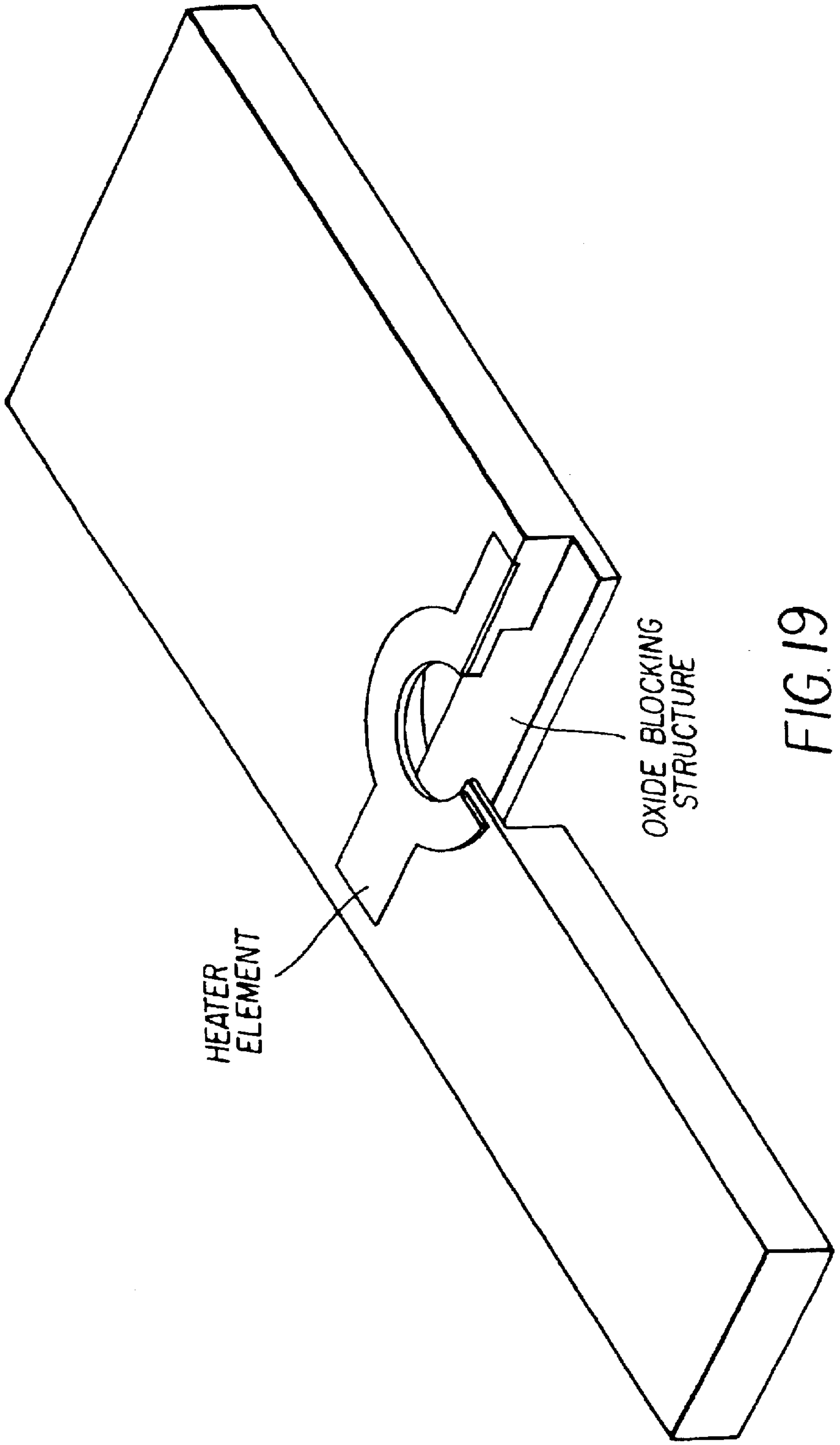
FIG. 19 is a perspective view illustrating a closer view of the oxide blocking structure.

The silicon wafer is then thinned from its initial thickness of 675 micrometers to approximately 300 micrometers. A mask to open the ink channels is then applied to the backside of the wafer and the silicon is then etched in an STS deep silicon etch system, all the way to the front surface of the silicon. Finally the sacrificial layer is etched from the backside and front side resulting in the finished device shown in FIGS. 15, 18 and 19. Alignment of the ink channel openings in the back of the wafer to the nozzle array in the front of the wafer may be provided with an aligner system such as the Karl Suss 1X aligner system.

Figure 16:
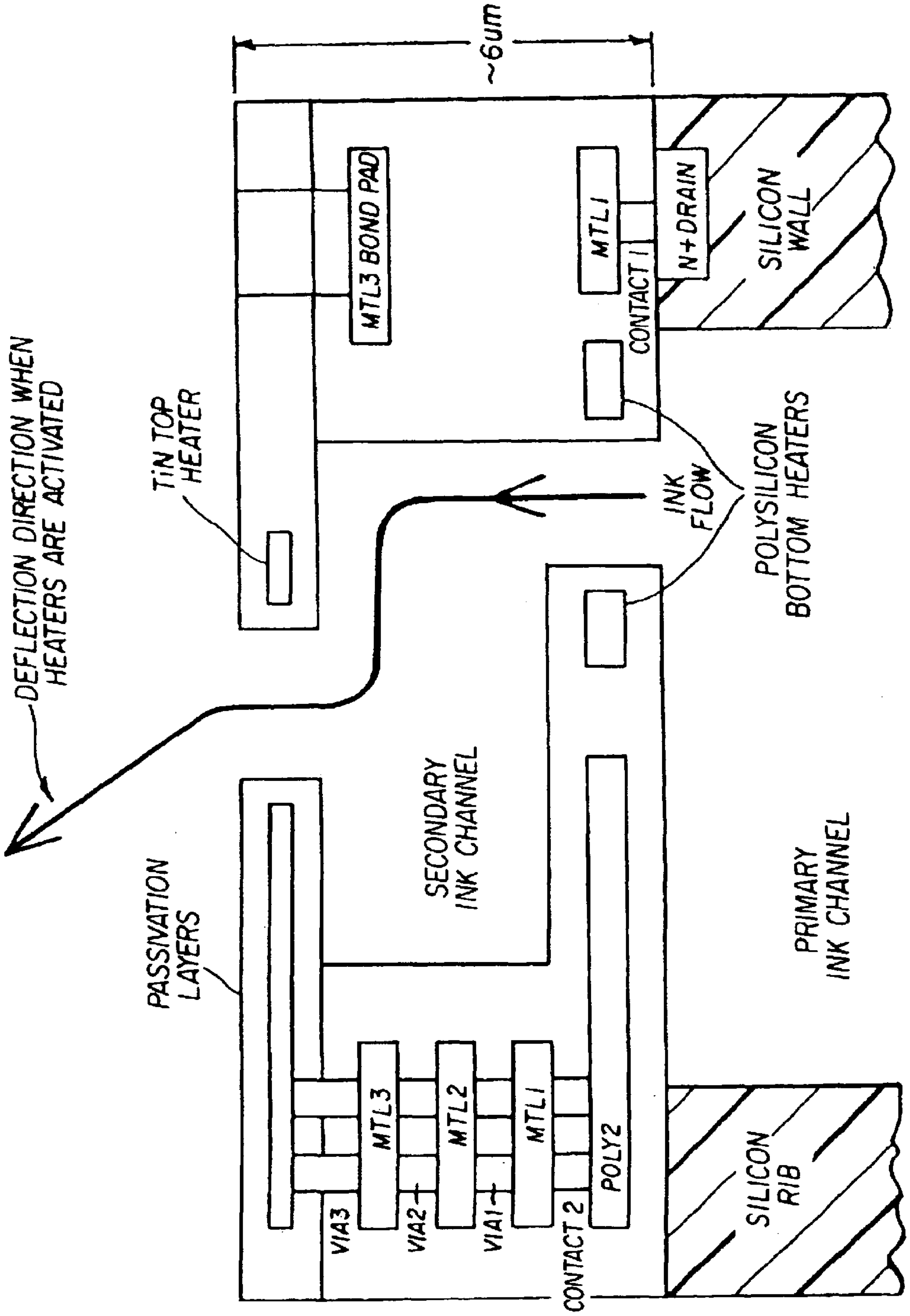
FIG. 16 is a schematic cross-sectional view taken along line A-B in the nozzle area showing top and dual bottom heaters providing lower temperature operation of the heaters and increased deflection of the jet stream.
Figure 17:
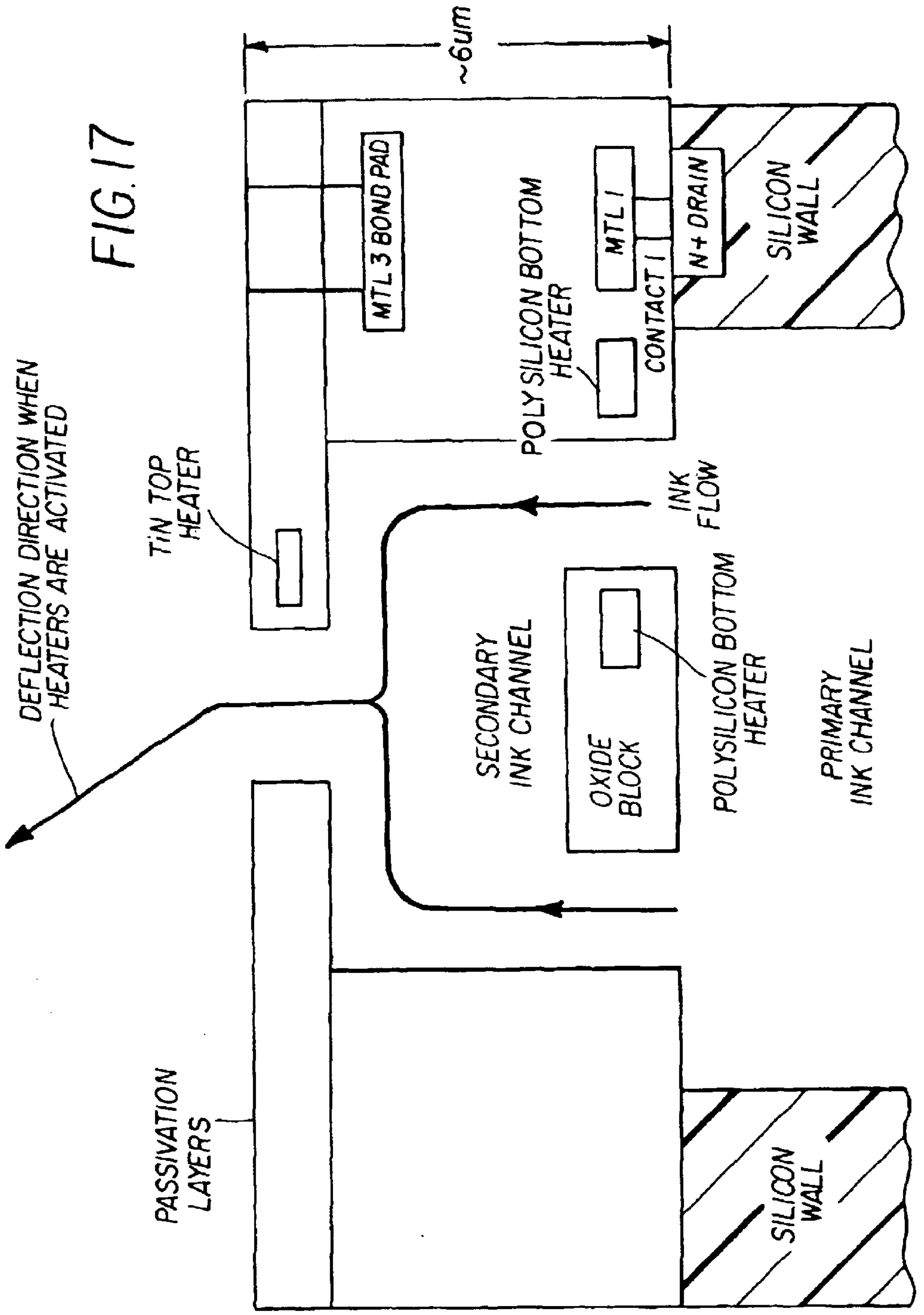
FIG. 17 is a schematic cross-sectional view similar to that of FIG. 16 but taken along line B—B.

As illustrated in FIGS. 16 and 17, the polysilicon type heater is incorporated in the bottom of the dielectric stack of each nozzle adjacent an access opening between a primary ink channel formed in the silicon substrate and a secondary ink channel formed in the oxide insulating layers. These heaters also contribute to reducing the viscosity of the ink asymmetrically. Thus as illustrated in FIG. 17, ink flow passing through the access opening at the right side of the blocking structure will be heated while ink flow passing through the access opening at the left side of the blocking structure will not be heated. This asymmetric preheating of the ink flow tends to reduce the viscosity of ink having the lateral momentum components desired for deflection and because more ink will tend to flow where the viscosity is reduced there is a greater tendency for deflection of the ink in the desired direction; i.e. away from the heating elements adjacent the bore. The polysilicon type heating elements can be of similar configuration to that of the primary heating elements adjacent the bore. Where heaters are used at both the top and the bottom of each nozzle bore, as illustrated in these figures, the temperature at which each individual heater operates can be reduced dramatically. The reliability of the TiN heaters is much improved when they are allowed to operate at temperatures well below their annealing temperature. The lateral flow structure made using the oxide block allows the location of the oxide block to be aligned to within 0.02 micrometers relative to the nozzle bore.

As shown schematically in FIG. 17, the ink flowing into the bore is dominated by lateral momentum components, which is what is desired for increased droplet deflection.

It is preferred to have etching of the silicon substrate be made to leave behind a silicon bridge or rib between each nozzle of the nozzle array during the etching of the ink channel. These bridges extend all the way from the back of the silicon wafer to the front of the silicon wafer. The ink channel pattern defined in the back of the wafer, therefore, is a series of small rectangular cavities each feeding a single nozzle. The ink cavities may be considered to each comprise a primary ink channel formed in the silicon substrate and a secondary ink channel formed in the oxide/nitride layers with the primary and secondary ink channels communicating through an access opening established in the oxide/nitride layer. These access openings require ink to flow under pressure between the primary and secondary channels and develop lateral flow components because direct axial access to the secondary ink channel is effectively blocked by the oxide block. The secondary ink channel communicates with the nozzle bore.

Figure 21:
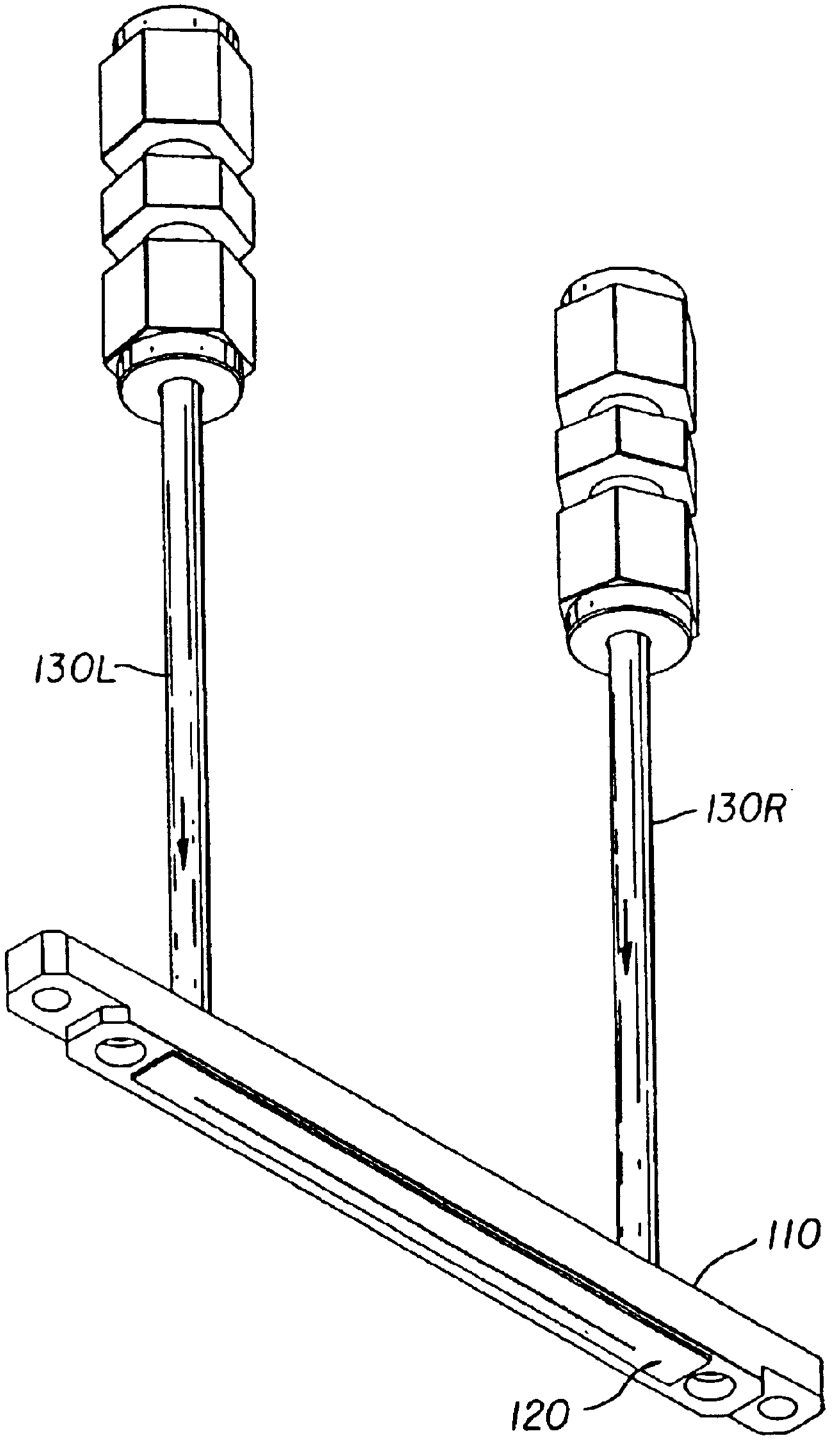
FIG. 21 is a perspective view of the CMOS/MEMS printhead formed in accordance with the invention and mounted on a supporting member into which ink is delivered.

With reference to FIG. 21 in the completed CMOS/MEMS print head 120 corresponding to any of the embodiments described herein is mounted on a supporting mount 110 having a pair of ink feed lines 130L, 130R connected adjacent end portions of the mount for feeding ink to ends of a longitudinally extending channel formed in the supporting mount. The channel faces the rear of the print head 120 and is thus in communication with the array of ink channels formed in the silicon substrate of the print head 120. The supporting mount, which could be a ceramic substrate, includes mounting holes at the ends for attachment of this structure to a printer system.

There has thus been described an improved ink jet printhead and methods of operating and forming same. The inkjet printheads are characterized by relative ease of manufacture and/or with relatively planar surfaces to facilitate cleaning and maintenance of the printhead and a relatively thin insulating layer or layers, such as a passivation layer or layers, through which is formed the nozzle bore. Adjacent each nozzle bore is an appropriate asymmetric heating element. The printhead described herein are suited for preparation in a conventional CMOS facility and the heater elements and channels and nozzle bore may be formed in a conventional MEMS facility.

Although the present invention has been described with particular reference to various preferred embodiments, the invention is not limited to the details thereof Various substitutions and modifications will occur to those of ordinary skill in the art, and all such substitutions and modifications are intended to fall within the scope of the invention as defined in the appended claims.

The invention has been described in detail with particular reference to certain preferred embodiments thereof, but it will be understood that variations and modifications can be effected within the spirit and scope of the invention.

What is claimed is:

1. A method of forming a continuous ink jet print head comprising:

providing a silicon substrate having an integrated circuit for controlling operation of the print head, the silicon substrate having an insulating layer or layers formed thereon, the insulating layer or layers having electrical conductors formed therein that are electrically connected to circuits formed in the silicon substrate;

forming in the insulating layer or layers a series of relatively large bores each of which extends from the surface of the insulating layer or layers to the silicon substrate;

depositing a sacrificial layer in each of the series of bores;

forming over the sacrificial layer in each bore an insulating layer or layers that includes a heater element;

forming a nozzle opening in the insulating layer or layers that includes the heater element; and removing the sacrificial layer from each of the bores to form a print head having a relatively planar surface around the area of the nozzle bores to facilitate maintenance of the printhead.

2. The method of claim 1 and wherein the insulting layer or layers that cover the silicon substrate include a heater element that is located proximate each bore for pre-heating ink prior to the ink entering a nozzle opening.

3. The method of claim 1 and wherein circuitry is fabricated on a silicon wafer as one or more integrated circuits.

4. The method according to claim 3 and wherein etching is provided of the insulating layer or layers to from in the insulating layer or layers a blocking structure, the sacrificial layer is thereafter deposited upon the blocking structure, and thereafter the nozzle opening in the insulating layer or layers that includes the heater element is then formed so that the nozzle opening is positioned such that fluid, in operation of the printhead, is caused to flow about the blocking structure and develop lateral momentum components when reaching the nozzle opening, and wherein each nozzle opening has a different blocking structure associated therewith.

5. The method of claim 3 and wherein gate electrodes of CMOS transistor devices are formed in a polysilicon layer.

6. The method according to claim 5 and wherein the insulating layers or layers has formed therein polysilicon and metal layers in a pattern or patterns.

7. The method according to claim 6 and wherein the silicon wafer is thinned from an initial thickness to a final thickness.

8. The method according to claim 7 and wherein ink channels are etched in a backside of the silicon wafer after thinning of the silicon wafer by etching the silicon wafer from the backside thereof all the way to a front surface of the silicon wafer.

9. The method according to claim 8 and wherein the etching creates silicon bridges that extend all the way from the backside of the silicon wafer to the front surface of the silicon wafer in a direction perpendicular to a row of nozzles to be formed in the nozzle array, adjacent silicon bridges being spaced so that a nozzle is formed therebetween.

10. The method according to claim 9 and wherein etching is provided of the insulating layer or layers to from in the insulating layer or layers a blocking structure, the sacrificial layer is thereafter deposited upon the blocking structure, and thereafter the nozzle opening in the insulating layer or layers that includes the heater element is then formed so that the nozzle opening is positioned such that fluid, in operation of the printhead, is caused to flow about the blocking structure and develop lateral momentum components when reaching the nozzle opening, and wherein each nozzle opening has a different blocking structure associated therewith.

11. A method of forming a continuous inkjet print head comprising:

providing a silicon substrate having an integrated circuit for controlling operation of the print head, the silicon substrate having an insulating layer or layers formed thereon, the insulating layer or layers having electrical conductors formed therein that are electrically connected to circuits formed in the silicon substrate;

forming in the insulating layer or layers a series of openings each of which extends from the surface of the insulating layer or layers to the silicon substrate;

depositing a sacrificial layer in each of the series of openings;

forming over the sacrificial layer in each opening an insulating layer or layers;

forming a nozzle opening in the insulating layer or layers; and removing the sacrificial layer from each of the bores to from a print head.

12. The method according to claim 11 and wherein etching is provided of the insulating layer or layers to form in the insulating layer or layers a blocking structure, the sacrificial layer is thereafter deposited upon the blocking structure, and thereafter the nozzle opening is then formed so that the nozzle opening is positioned such that fluid, in operation of the printhead, is caused to flow about the blocking structure and develop lateral momentum components when reaching the nozzle opening, and wherein each nozzle opening has a different blocking structure associated therewith.

13. The method according to claim 11 and wherein the silicon substrate is in the form of a wafer and ink channels are etched in a backside of the wafer after thinning of the silicon wafer by etching the silicon wafer from the backside thereof all the way to a front surface of the silicon wafer.

14. The method according to claim 13 and wherein the etching in the backside of the wafer creates silicon bridges that extend all the way from the backside of the silicon wafer to the front surface of the silicon wafer in a direction perpendicular to a row of nozzles to be formed in the nozzle array, adjacent silicon bridges being spaced so that a nozzle is formed therebetween.

15. The method according to claim 14 aid wherein etching is provided of the insulating layer or layers to form in the insulating layer or layers a blocking structure, the sacrificial layer is thereafter deposited upon the blocking structure, and thereafter the nozzle opening is then formed so that the nozzle opening is positioned such that fluid, in operation of the printhead, is caused to flow about the blocking structure and develop lateral momentum components when reaching the nozzle opening, and wherein each nozzle opening has a different blocking structure associated therewith.

16. The method according to claim 13 and wherein etching is provided of the insulating layer or layers to form in the insulating layer or layers a blocking structure, the sacrificial layer is thereafter deposited upon the blocking structure, and thereafter the nozzle opening is then formed so that the nozzle opening is positioned such that fluid, in operation of the printhead, is caused to flow about the blocking structure and develop lateral momentum components when reaching the nozzle opening, and wherein each nozzle opening has a different blocking structure associated therewith.

17. A method of forming an ink jet print head comprising:

providing a silicon substrate having an integrated circuit for controlling operation of the print head, the silicon substrate having an insulating layer or layers formed thereon, the insulating layer or layers having electrical conductors formed therein that are electrically connected to circuits formed in the silicon substrate;

forming in the insulating layer or layers a series of openings each of which extends from the surface of the insulating layer or layers to the silicon substrate;

depositing a sacrificial layer in each of the series of openings;

forming over the sacrificial layer in each opening an insulating layer or layers as a membrane;

forming a nozzle opening in the membrane; and removing the sacrificial layer from each of the bores to form a print head.

18. The method of claim 17 and wherein circuitry is fabricated on a silicon wafer as one or more integrated circuits.

19. The method of claim 18 and wherein gate electrodes of CMOS transistor devices are formed in a polysilicon layer.

20. The method according to claim 19 and wherein the insulating layers or layers has formed therein polysilicon and metal layers in a pattern or patterns.

21. The method according to claim 20 and wherein the silicon wafer is thinned from an initial thickness to a final thickness.

22. The method according to claim 17 and wherein there is a step of etching from a backside of the silicon substrate that creates silicon bridges that extends all the way from the backside of the silicon substrate to a front surface of the silicon substrate in a direction perpendicular to a row of nozzles to be formed in the nozzle array, with adjacent silicon bridges being spaced so that a nozzle is formed therebetween.

23. The method of claim 17 and wherein the thickness of a membrane which defines the thickness of the bore is in the range of 0.5 micrometers to 2.5 micrometers.

* * * * *